United States Patent
Silva

(10) Patent No.: US 8,665,127 B2
(45) Date of Patent: *Mar. 4, 2014

(54) Σ-Δ DIFFERENCE-OF-SQUARES RMS TO DC CONVERTER WITH MULTIPLE FEEDBACK PATHS

(75) Inventor: Paulo Gustavo Raymundo Silva, Delft (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/962,932

(22) Filed: Dec. 8, 2010

(65) Prior Publication Data

US 2012/0146823 A1    Jun. 14, 2012

(51) Int. Cl.
*H03M 3/00* (2006.01)

(52) U.S. Cl.
USPC ........... 341/143; 327/179; 327/348; 327/349; 375/316; 375/296; 455/296; 455/311; 341/155

(58) Field of Classification Search
USPC ................. 341/143–160; 327/179, 348, 349; 455/296, 311, 226.1; 375/316
See application file for complete search history.

(56) References Cited

U.S. PATENT DOCUMENTS

| | | | |
|---|---|---|---|
| 3,562,552 A | 2/1971 | Baudino | |
| 3,657,528 A | 4/1972 | Plante | |
| 5,585,757 A | 12/1996 | Frey | |
| 5,896,056 A | 4/1999 | Glucina | |
| 6,172,549 B1 | 1/2001 | Gilbert | |
| 6,204,719 B1 | 3/2001 | Gilbert | |
| 6,348,829 B1 | 2/2002 | Gilbert | |
| 6,359,576 B1 | 3/2002 | Petrofsky | |
| 6,429,720 B1 | 8/2002 | Gilbert | |
| 6,437,630 B1 | 8/2002 | Gilbert | |
| 6,549,057 B1 | 4/2003 | Gilbert | |
| 6,584,157 B1 | 6/2003 | Van Der Zwan et al. | |
| 7,002,394 B1 | 2/2006 | Gilbert | |
| 7,106,604 B2 | 9/2006 | Nash | |
| 7,197,292 B1 | 3/2007 | Kouwenhoven et al. | |
| 7,333,567 B2 | 2/2008 | Ma et al. | |
| 7,545,302 B1 * | 6/2009 | Silva et al. | 341/143 |
| 7,545,303 B1 * | 6/2009 | Silva et al. | 341/143 |
| 7,697,909 B2 * | 4/2010 | Kouwenhoven | 455/226.1 |
| 2007/0270116 A1 | 11/2007 | Kouwenhoven | |
| 2009/0072874 A1 | 3/2009 | Sundstrom | |
| 2010/0194461 A1 * | 8/2010 | Kouwenhoven | 327/348 |

OTHER PUBLICATIONS

James C. Candy. "A Use of Limit Cycle Oscillations to Obtain Robust Analog-to-Digital Converters". IEEE Journal of Solid-State Circuits, vol. 22, No. 3, Mar. 1974, pp. 298-305.

(Continued)

*Primary Examiner* — Lam T Mai
(74) *Attorney, Agent, or Firm* — Andrew Viger; Wade J. Brady, III; Frederick J. Telecky, Jr.

(57) ABSTRACT

Architectures of ΣΔ difference-of-squares RMS-to-digital converters employing multiple feedback paths. Additional feedback paths enable a stable ΣΔ closed-loop behavior in different topologies where the RMS level of the quantization error processed by the squaring non-linearity is minimized. Such feedback paths include lowpass filtered and constant gain feedback paths, lowpass and highpass filtered paths or multiple lowpass filtered paths. These can be combined with multiple integrators in the forward path, with frequency compensation provided by additional feedforward or feedback paths. Electronic configurability can further extend the total input referred dynamic range (DR) of such architectures.

20 Claims, 22 Drawing Sheets

(56) References Cited

OTHER PUBLICATIONS

S. Norsworthy, R. Schreier, G. Temes. "Delta-Sigma Data Converters—Theory, Design, and Simulation". IEEE Press, 1997.

Barrie Gilbert. "A novel technique for RMS-DC conversion based on the difference of squares". Electronics Letters, vol. 11, No. 8, Apr. 17, 1975, pp. 181-182.

Rudy van de Plassche. "CMOS Integrated Analog-to-Digital and Digital-to-Analog Converters". Kluwer Academic Publishers, 2003.

M.H.L. Kouwenhoven and A. van Staveren. "Mean-Square Power Dectector with Integrated Offset Chopper". ISSCC Digest of Technical papers, pp. 92-93, Feb. 2005.

* cited by examiner

Σ-Δ DIFFERENCE-OF-SQUARES RMS TO DC CONVERTER WITH MULTIPLE FEEDBACK PATHS

FIELD OF THE INVENTION

The present invention relates to sigma-delta modulators, and in particular, to sigma-delta modulators used for converting root-mean-square (RMS) signal values to direct current (DC) signals.

RELATED ART

Digital RMS-to-DC converters are electronic circuits that generate a digitally encoded output signal, whose average (DC-level) is proportional to the Root-Mean-Square value (the square-root of the power) of the input signal. RMS-to-DC converters are used in a variety of applications, such as test and measurement, and communications, were a measure of the signal strength is important. A specific property of such devices is that their response is insensitive to crest factor variations. This is especially important in applications were the converter input signals can attain multiple different formats (modulation parameters, variable coding, etc. . . . ). In the context of mobile communication equipments (e.g. cellular telephones and base stations), the power level that is transmitted via the antenna needs to be measured accurately.

The block diagram in FIG. 1 illustrates the back-end section of a handset. The antenna is connected to a duplexer, i.e. a switch to redirect either the signal to be transmitted to the antenna or to redirect the received signal from the antenna to the receiver circuit (Rx). The power amplifier (PA) that supplies the RF signal to be transmitted is connected via a coupler to the antenna. The coupler feeds a fixed portion (on the order of 10%) of the transmitted power to the digital power detector. The detector provides a digitally encoded estimation of the transmitted power to the digital control block. Based on the measurement results obtained from this detector, the variable gain amplifier (VGA) is controlled to obtain the required transmit-power level. Alternatively, in order to increase the PA efficiency, the detector output can be used directly to control the PA's power supply adjustable DC-DC converter unity (SUPA)

Over the years, several types of analog RF power detectors have been used. These detectors range from a single diode to complex systems with higher accuracy and temperature stability.

The ΣΔ modulator can be combined with the difference-of-squares RMS-to-DC converter, resulting in an RMS-to-DC converter with intrinsic digital output. This mixed-signal system is named "ΣΔ difference-of-squares RMS-to-DC converter" and is described in U.S. Pat. Nos. 7,545,302 and 7,545,303 (the disclosures of which are incorporated herein by reference). In this architecture, the measured RMS level of the RF input is coded as the DC level of the modulator digital output bitstream y[k]. The ΣΔ difference-of-squares RMS-to-DC converter can be implemented based on feedforward and feedback squaring operations as depicted in FIG. 2A, or around a forward path multiplier as depicted in FIG. 2B.

The large-signal operation of ΣΔ RMS-to-DC converters is similar to the operation of their analog counterparts. In FIGS. 2A and 2B, the error signal e(t) is proportional to the difference between the squared input signal $x(t)^2$ and the squared feedback signal $y(t)^2$. The feedback signal $y(t)=y_{DC}+q(t)$ is the analog version of the digital output y[k], where $y_{DC}$ is the DC level of the modulator output and q(t) is the quantization error added during the internal analog-to-digital conversion of the integrator output u(t). Based on the relation between y(t), x(t) and u(t), the large-signal static transfer of the ΣΔ difference-of-squares RMS-to-DC converter can be calculated:

$$y_{DC} = \frac{-1}{2AK_y} + \sqrt{\frac{1}{(2AK_y)^2} + \frac{K_x}{K_y}\overline{x(t)^2} - \overline{q(t)^2}} \quad (1A)$$

$$y_{DC} = \frac{-1}{2AK_m\beta_y^2} + \sqrt{\frac{1}{(2AK_m\beta_y^2)^2} + \frac{\beta_x^2}{\beta_y^2}\overline{x(t)^2} - \overline{q(t)^2}} \quad (1B)$$

where A is the actual integrator DC-gain, expression (1A) was obtained based on FIG. 2A and expression (1B) was obtained based on FIG. 2B. When A approaches infinity, (1A) and (1B) become:

$$\lim_{A\to\infty} y_{DC} = \sqrt{\frac{K_x}{K_y}\overline{x(t)^2} - \overline{q(t)^2}} = \sqrt{\frac{K_x}{K_y}x_{RMS}^2 - q_{RMS}^2} \quad (2A)$$

$$\lim_{A\to\infty} y_{DC} = \sqrt{\frac{\beta_x^2}{\beta_y^2}\overline{x(t)^2} - \overline{q(t)^2}} = \sqrt{\frac{\beta_x^2}{\beta_y^2}x_{RMS}^2 - q_{RMS}^2} \quad (2B)$$

The steady-state DC solution for the ΣΔ RMS-to-DC converter depicted in FIGS. 2A and 2B is very similar to the solution obtained for analog RMS-to-DC converters. The major difference is the additional term accounting for the quantization error mean-square value $q_{RMS}^2$. This term arises from the fact that the feedback bitstream, containing both the measured input RMS level at DC and the added quantization error at high frequencies, is squared. In practice, the value of $q_{RMS}^2$ influences the law-conformance error for small input-power levels and defines the lower limit of the input-referred dynamic range. When $q_{RMS}^2 > x_{RMS}^2$, expressions (2A) and (2B) are no longer valid and the integrator's output u(t) clips to the negative supply voltage.

The addition of a filter in the feedback path allows an effective reduction of the quantization error mean-square value before the squaring operation. This technique is especially useful in the case of single-bit (M=1) internal quantization. The block diagrams of ΣΔ RMS-to-DC converters employing filtering in the feedback path are depicted in FIGS. 3A and 3B.

Based on FIGS. 3A and 3B, the large-signal static transfer of the ΣΔ difference-of-squares RMS-to-DC converters can be again calculated (A→∞):

$$\lim_{A\to\infty} y_{DC} = \sqrt{\frac{K_x}{K_y}\overline{x(t)^2} - \overline{q_f(t)^2}} \quad (3A)$$

$$\lim_{A\to\infty} y_{DC} = \sqrt{\frac{\beta_x^2}{\beta_y^2}\overline{x(t)^2} - \overline{q_f(t)^2}} \quad (3B)$$

where $q_f(t)=y_f(t)-y_{DC}$ is the filtered quantization noise error. Because the mean-square value of the filtered quantization error is smaller ($\overline{q_f(t)^2} < \overline{q(t)^2}$), the digital detector's output dynamic range is extended. However, the addition of a filter in the feedback path may impact the stability of the ΣΔ RMS-to-DC converter. In order to analyze the converter's closed loop stability, the signal-dependent AC-gain k associated with the non-linear feedback and feedforward squaring operations has to be defined. When the ΣΔ difference-of-squares modulator is implemented with two squaring cells, as in FIGS. 2A and 3A, k is given by ($K_x=K_y$):

$$k = \frac{d}{dv}(K_x \cdot v^2)\bigg|_{v=x_{RMS}} = 2 \cdot K_x \cdot x_{RMS} \quad (4A)$$

When the ΣΔ difference-of-squares modulator is implemented with a forward path multiplier, as in FIGS. 2B and 3B, k is given by ($\beta_x=\beta_y$):

$$k = \frac{d}{dv}(K_m \cdot \beta_x^2 \cdot v^2)\bigg|_{v=x_{RMS}} = 2 \cdot K_m \cdot \beta_x^2 \cdot x_{RMS} \quad (4B)$$

The mean-square value of the filtered quantization noise $q_f(t)$ is minimized in ΣΔ RMS-to-DC converter architectures shown in FIGS. 3A and 3B when the chosen feedback filter is an $N^{th}$-order lowpass filter (LPF) with $-20*N$ dB/dec attenuation. FIG. 4 shows the AC linearized model for this situation.

Based on FIG. 4, the signal-dependent feedback loop filter $L_1(s)$ can be expressed:

$$L_1(s) = \frac{U(s)}{Y(s)} = -\frac{k\omega_1}{s(s\tau_P+1)^N} \quad (5)$$

Because (5) contains N+1 poles and no zeros, the choice of a LPF (of any order N) in the feedback path of the architecture shown in FIGS. 3A and 3B always yields unstable ΣΔ RMS-to-DC converters. In order to implement stable ΣΔ RMS-to-DC converters, the $N^{th}$-order feedback LPF should be compensated with N high-frequency zeros as depicted in FIG. 5.

Based on FIG. 5, the signal-dependent feedback loop filter $L_1(s)$ can be again expressed:

$$L_1(s) = \frac{U(s)}{Y(s)} = -\frac{k\omega_1}{s} \cdot \frac{(s\tau_Z+1)^N}{(s\tau_P+1)^N} \quad (6)$$

Because (5) contains N+1 poles and N zeros, it is possible to design and implement stable ΣΔ RMS-to-DC converters based on the architecture shown in FIGS. 3A and 3B when the feedback filter contains N poles and zeros. The price paid for the stability of the closed loop system is an increase on the obtained mean-square value of the filtered quantization noise $q_f(t)$. This happens because the pole-zero filter $-20*N$ dB/dec attenuation roll-off takes place only within a limited frequency range below half the system's sampling frequency ($f_s/2$).

SUMMARY

Architectures of ΣΔ difference-of-squares RMS-to-digital converters employing multiple feedback paths. Additional feedback paths enable a stable ΣΔ closed-loop behavior in different topologies where the RMS level of the quantization error processed by the squaring non-linearity is minimized. Such feedback paths include lowpass filtered and constant gain feedback paths, lowpass and highpass filtered paths or multiple lowpass filtered paths. These can be combined with multiple integrators in the forward path, with frequency compensation provided by additional feedforward or feedback paths. Electronic configurability can further extend the total input referred dynamic range (DR) of such architectures.

In accordance with one embodiment of the presently claimed invention, a sigma-delta difference-of-squares RMS-to-DC converter includes:

analog signal multiplication and combining circuitry responsive to an analog input signal and at least first and second analog feedback signals by providing a resultant analog signal that includes at least one signal component corresponding to a difference between a square of the analog input signal, a square of the first analog feedback signal and the second analog feedback signal;

analog signal filter circuitry coupled to the analog signal multiplication and combining circuitry, and responsive to the resultant analog signal by providing a filtered analog signal;

analog-to-digital conversion (ADC) circuitry coupled to the analog signal filter circuitry and responsive to the filtered analog signal by providing a related digital output signal;

digital-to-analog conversion (DAC) circuitry coupled to the ADC circuitry and responsive to the digital output signal by providing an analog signal;

first feedback circuitry coupled between the DAC circuitry and the analog signal multiplication and combining circuitry, and responsive to the analog signal by providing the first analog feedback signal; and second feedback circuitry coupled between the DAC circuitry and the analog signal multiplication and combining circuitry, and responsive to the analog signal by providing the second analog feedback signal.

In accordance with another embodiment of the presently claimed invention, a sigma-delta difference-of-squares RMS-to-DC converter includes:

analog signal multiplier and combiner means for multiplying and combining an analog input signal and at least first and second analog feedback signals to provide a resultant analog signal that includes at least one signal component corresponding to a difference between a square of the analog input signal, a square of the first analog feedback signal and the second analog feedback signal;

analog signal filter means for filtering the resultant analog signal to provide a filtered analog signal;

analog-to-digital converter (ADC) means for converting the filtered analog signal to a related digital output signal;

digital-to-analog converter (DAC) means for converting the digital output signal to an analog signal;

first feedback means for processing the analog signal to provide the first analog feedback signal; and second feedback means for processing the analog signal to provide the second analog feedback signal.

In accordance with another embodiment of the presently claimed invention, a method for performing a sigma-delta difference-of-squares RMS-to-DC conversion includes:

multiplying and combining an analog input signal and at least first and second analog feedback signals to provide a resultant analog signal that includes at least one signal component corresponding to a difference between a square of the analog input signal, a square of the first analog feedback signal and the second analog feedback signal;

filtering the resultant analog signal to provide a filtered analog signal;

converting the filtered analog signal to a related digital output signal;

converting the digital output signal to an analog signal;

processing the analog signal to provide the first analog feedback signal; and processing the analog signal to provide the second analog feedback signal.

In accordance with another embodiment of the presently claimed invention, a sigma-delta difference-of-squares RMS-to-DC converter includes:

analog signal multiplication and combining circuitry responsive to an analog input signal and a first analog feedback signal by providing a resultant analog signal that includes at least one signal component corresponding to a difference between a square of the analog input signal and a square of the first analog feedback signal;

analog signal filtering and combining circuitry coupled to the analog signal multiplication and combining circuitry, and responsive to the resultant analog signal and at least a second analog feedback signal by providing a feedforward signal;

analog-to-digital conversion (ADC) circuitry coupled to the analog signal filtering and combining circuitry and responsive to the feedforward signal by providing a related digital output signal; and feedback circuitry, including digital-to-analog conversion (DAC) circuitry, coupled between the ADC circuitry, the analog signal multiplication and combining circuitry and the analog signal combining circuitry, and responsive to the digital output signal by providing the first analog feedback signal and the at least a second analog feedback signal.

In accordance with another embodiment of the presently claimed invention, a sigma-delta difference-of-squares RMS-to-DC converter includes:

analog signal multiplier and combiner means for multiplying and combining an analog input signal and a first analog feedback signal to provide a resultant analog signal that includes at least one signal component corresponding to a difference between a square of the analog input signal and a square of the first analog feedback signal;

analog signal filter and combiner means for filtering and combining the resultant analog signal and at least a second analog feedback signal to provide a feedforward signal;

analog-to-digital converter (ADC) means for converting the feedforward signal to a related digital output signal; and feedback means, including digital-to-analog converter (DAC) means, for converting the digital output signal to the first analog feedback signal and the at least a second analog feedback signal.

In accordance with another embodiment of the presently claimed invention, a method for performing a sigma-delta difference-of-squares RMS-to-DC conversion includes:

multiplying and combining an analog input signal and a first analog feedback signal to provide a resultant analog signal that includes at least one signal component corresponding to a difference between a square of the analog input signal and a square of the first analog feedback signal;

filtering and combining the resultant analog signal and at least a second analog feedback signal to provide a feedforward signal;

converting the feedforward signal to a related digital output signal; and converting the digital output signal to the first analog feedback signal and the at least a second analog feedback signal.

DETAILED DESCRIPTION

Figure 1:
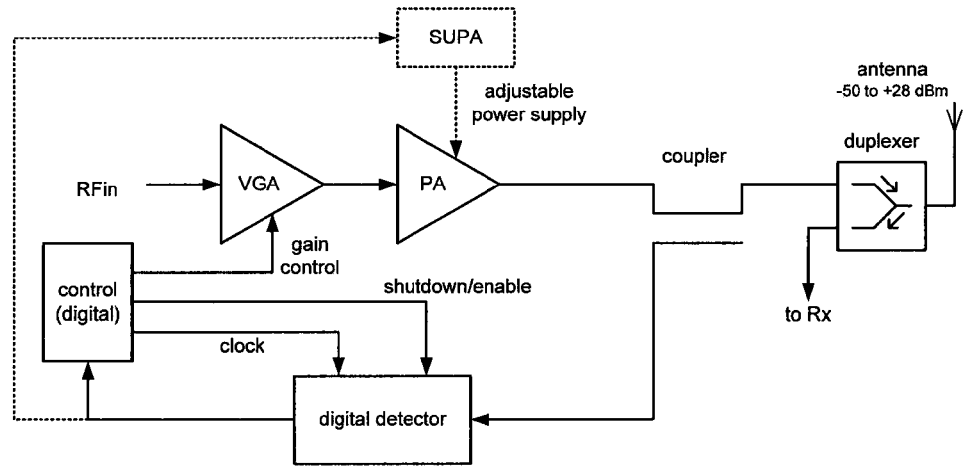
FIG. 1 depicts a typical application diagram of a digital RF power detector.
Figure 2A:
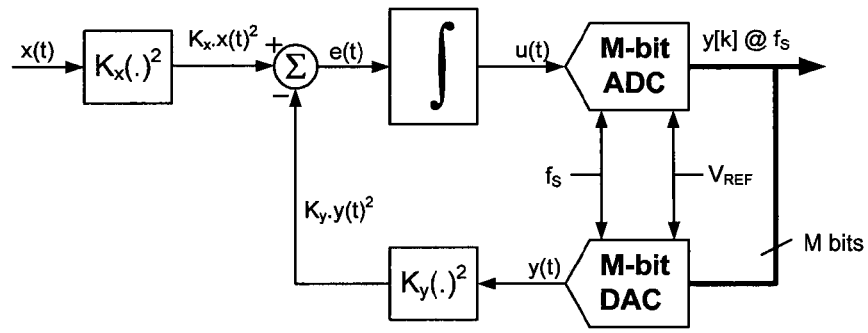
FIG. 2A depicts a $\Sigma\Delta$ difference-of-squares RMS-to-DC converter using two squaring circuits.
Figure 2B:
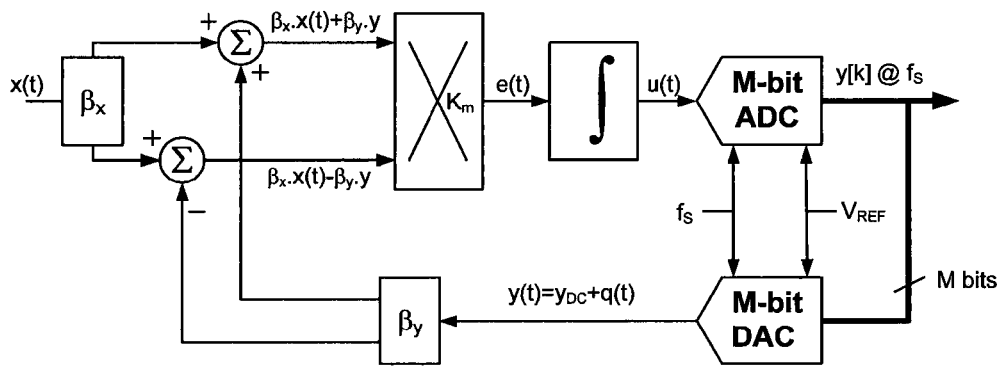
FIG. 2B depicts a $\Sigma\Delta$ difference-of-squares RMS-to-DC converter based on forward path multiplier.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the Figures illustrate diagrams of the functional blocks of various embodiments, the functional blocks are not necessarily indicative of the division between hardware circuitry. Thus, for example, one or more of the functional blocks (e.g., processors, memories, etc.) may be implemented in a single piece of hardware (e.g., a general purpose signal processor, random access memory, hard disk drive, etc.). Similarly, any programs described may be standalone programs, may be incorporated as subroutines in an operating system, may be functions in an installed software package, etc.

Discussed below are several architectures of ΣΔ difference-of-squares RMS-to-DC converters with multiple feedback paths for providing multiple processed (e.g., filtered, scaled, or filtered and scaled) feedback signals. The addition of extra feedback paths allows the design of stable ΣΔ RMS to digital converters where the main feedback path feeding the non-linear squaring operation contains an $N^{th}$-order LPF with −20*N dB/dec roll-off attenuation for frequencies far beyond the system sampling frequency ($f_s$). Described below is a ΣΔ RMS-to-DC converter with lowpass filtered and constant gain feedback paths. Also described below is a ΣΔ RMS-to-DC converter with lowpass and highpass filtered feedback paths. Also described below is a ΣΔ RMS-to-DC converter with multiple lowpass filtered feedback paths. Also described below is how these techniques are combined with multiple integrators stabilized by, respectively, additional feedforward and feedback paths. As also described below, the concept of configurability is applied to all architectures previously described.

Figure 4:
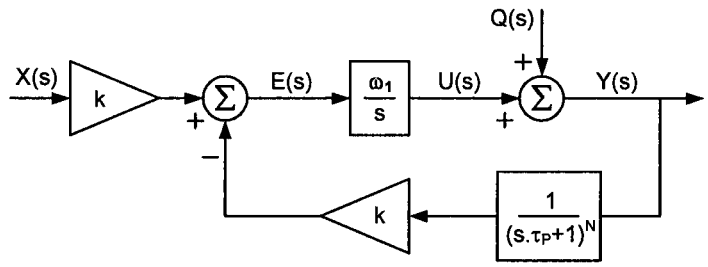
FIG. 4 depicts a $\Sigma\Delta$ difference-of-squares RMS-to-DC converter small-signal linear model with $N^{th}$-order LPF in the feedback path.
Figure 5:
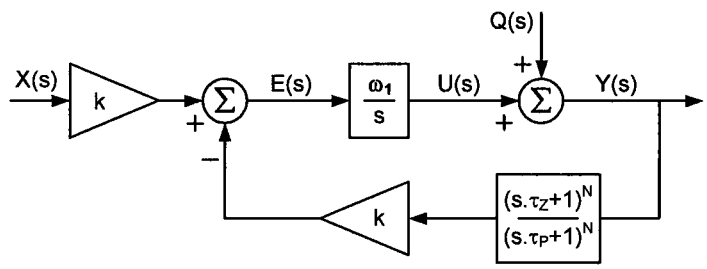
FIG. 5 depicts a $\Sigma\Delta$ difference-of-squares RMS-to-DC converter small-signal linear model with $N^{th}$-order Pole-Zero filter in the feedback path.

The simplest way to stabilize the ΣΔ RMS-to-DC converter architecture depicted in FIG. 4, without compromising the high-frequency quantization error attenuation as in FIG. 5, is to add a second feedback path with signal scaling, e.g., provided by an amplifier with constant gain $K_c$. This situation is depicted in FIG. 6 where a generic $N^{th}$-order LPF is in series with the feedback path connected to the non-linear squaring operation (represented by the linearized AC-gain k).

Figure 6:
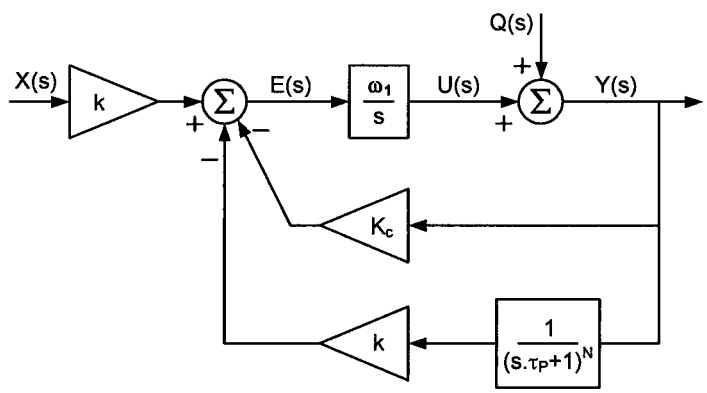
FIG. 6 depicts a $\Sigma\Delta$ difference-of-squares RMS-to-DC converter small-signal linear model for the architecture depicted in FIGS. 7A/7B.

Based on FIG. 6, the signal-dependent feedback loop filter $L_1(s)$ can be expressed:

$$L_1(s) = \frac{U(s)}{Y(s)} = -\frac{\omega_1}{s} \cdot \left( \frac{k + K_c \cdot (s\tau_P + 1)^N}{(s\tau_P + 1)^N} \right) \quad (7)$$

The resulting transfer function contains N+1 poles and N zeros, and it can be designed to be conditionally stable for a certain range of input power levels ($k \propto x_{RMS}$). The greater the filter order N is, the more difficult it becomes to design a stable loop filter for high input power levels ($k \to \infty$):

$$\lim_{k \gg K_c} L_1(s) = -\frac{k\omega_1}{s} \cdot \frac{1}{(s\tau_P + 1)^N} \quad (8)$$

In the case of very small input power levels ($k \to 0$), $L_1(s)$ becomes an always stable $1^{st}$ order loop filter:

$$\lim_{k \ll K_c} L_1(s) = -\frac{K_c \omega_1}{s} \quad (9)$$

Figure 7A:
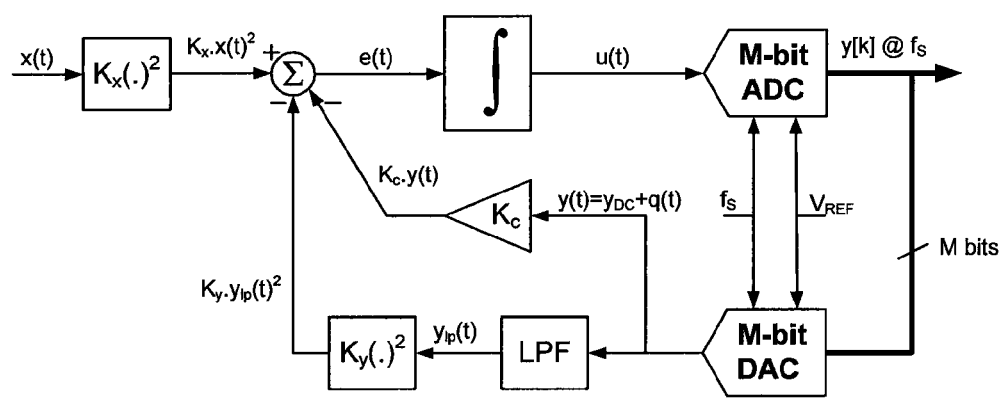
FIG. 7A depicts a $\Sigma\Delta$ difference-of-squares RMS-to-DC converter using two squaring circuits with additional constant feedback path.
Figure 7B:
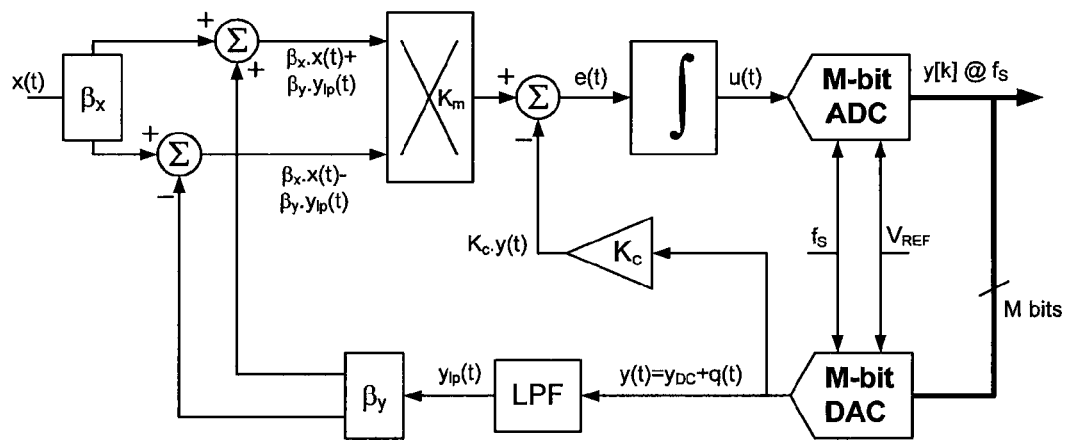
FIG. 7B depicts a $\Sigma\Delta$ difference-of-squares RMS-to-DC converter based on forward path multiplier with additional constant feedback path.

FIGS. 7A and 7B show the main possible implementations of a ΣΔ difference-of-squares RMS-to-DC converter based on the linearized closed loop system in FIG. 6. Equivalent implementations can be achieved when two separated feedback DACs are employed and/or the LPF is implemented in the digital domain. The LPF transfer function, depicted as an $N^{th}$-order binomial in the above calculations, can be implemented with any different set of coefficients (e.g. Butterworth, Chebyshev, etc. . . . ).

Figure 8:
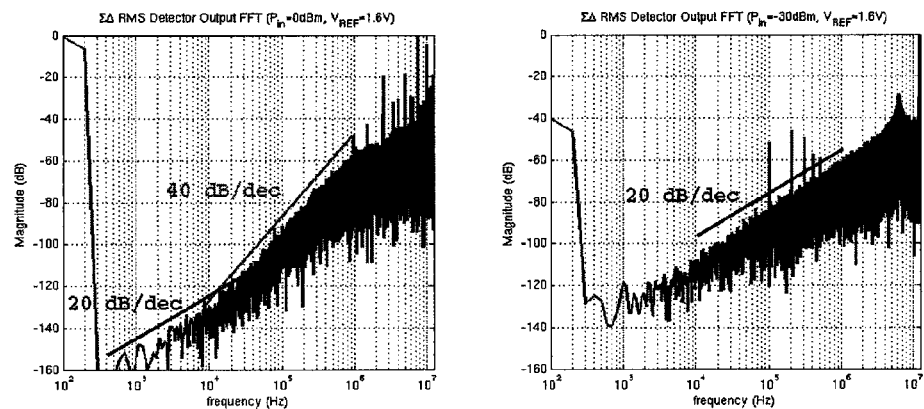
FIG. 8 depicts a simulated output spectrum of the $\Sigma\Delta$ RMS-to-DC converter architectures depicted in FIGS. 7A/7B for a $1^{st}$-order LPF, $K_c=K_y/50=\beta_y^2 K_m/50$ and $P_{in}=0$ dBm or $-30$ dBm.

The simulated output spectrum of the ΣΔ RMS-to-DC converter architectures depicted in FIGS. 7A/7B is shown in FIG. 8 when a $1^{st}$-order LPF is employed in the feedback path and $V_{ref}$ (the ADC/DAC reference voltage) is set to 1.6V. For $P_{in}=0$ dBm, the modulator output is stable and the quantization noise presents a $2^{nd}$-order roll-off (40 dB/dec) as predicted by (7). For $P_{in}=-30$ dBm, the quantization noise presents a $1^{st}$-order roll-off (20 dB/dec) as predicted by (9)

Based on the relation between y(t), x(t) and u(t), the large-signal static transfer of the ΣΔ difference-of-squares RMS-to-DC converters shown in FIGS. 7A and 7B can be calculated:

$$y_{DC} = -\left(\frac{1}{2AK_y} + \frac{K_c}{2K_y}\right) + \sqrt{\left(\frac{1}{2AK_y} + \frac{K_c}{2K_y}\right)^2 + \frac{K_x}{K_y}\overline{x(t)^2} - \overline{q_{lp}(t)^2}} \quad (10A)$$

$$y_{DC} = -\left(\frac{1}{2AK_m\beta_y^2} + \frac{K_c}{2K_m\beta_y^2}\right) +$$

$$\sqrt{\left(\frac{1}{2AK_m\beta_y^2} + \frac{K_c}{2K_m\beta_y^2}\right)^2 + \frac{\beta_x^2}{\beta_y^2}\overline{x(t)^2} - \overline{q_{lp}(t)^2}} \quad (10B)$$

where A is the actual integrator DC-gain, $q_{lp}(t) = y_{lp}(t) - y_{DC}$ is the lowpass filtered quantization noise error, expression (10A) was obtained based on FIG. 7A and expression (10B) was obtained based on FIG. 7B. When A approaches infinity, (10A) and (10B) become:

$$\lim_{A \to \infty} y_{DC} = -\frac{K_c}{2K_y} + \sqrt{\left(\frac{K_c}{2K_y}\right)^2 + \frac{K_x}{K_y}\overline{x(t)^2} - \overline{q_{lp}(t)^2}} \quad (11A)$$

$$\lim_{A \to \infty} y_{DC} = \frac{-K_c}{2K_m\beta_y^2} + \sqrt{\left(\frac{K_c}{2K_m\beta_y^2}\right)^2 + \frac{\beta_x^2}{\beta_y^2}\overline{x(t)^2} - \overline{q_{lp}(t)^2}} \quad (11B)$$

Figure 9:
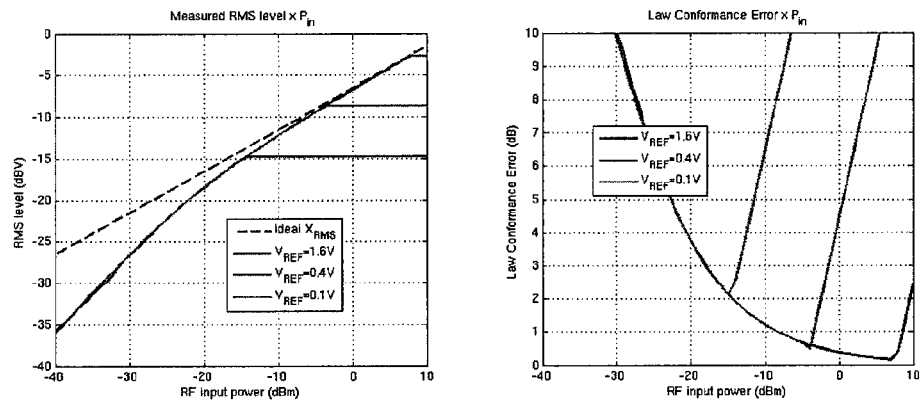
FIG. 9 depicts a simulated transfer curve and law-conformance error of the $\Sigma\Delta$ RMS-to-DC converter architectures depicted in FIGS. 7A/7B for a $1^{st}$-order LPF and $K_c=K_y/50=\beta_y^2 K_m/50$.

The steady-state DC solution for the ΣΔ RMS-to-DC converters depicted in FIGS. 7A and 7B present two main characteristics. First, the RMS level of the squared quantization error is reduced ($\overline{q_{lp}(t)^2} < \overline{q(t)^2}$) by the feedback LPF. Second, an undesirable systematic error proportional to $K_c$ is added to the converter's DC transfer characteristic. The simulated transfer curve and the law-conformance error for these ΣΔ RMS-to-DC converter architectures are shown in FIG. 9 when a $1^{st}$-order LPF is employed in the feedback path and $K_c = K_y/50 = \beta_y^2 K_m/50$.

Figure 10A:
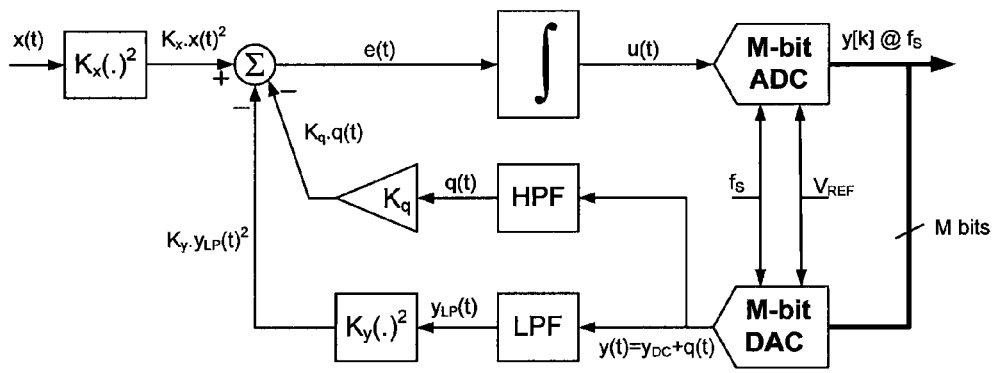
FIG. 10A depicts a $\Sigma\Delta$ difference-of-squares RMS-to-DC converter using two squaring circuits with lowpass and highpass filtered feedback paths.
Figure 10B:
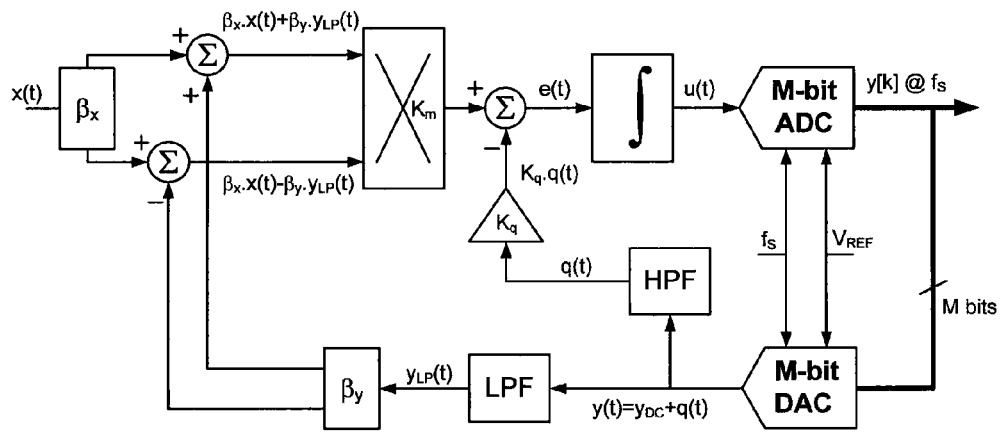
FIG. 10B depicts a $\Sigma\Delta$ difference-of-squares RMS-to-DC converter based on forward path multiplier with lowpass and highpass filtered feedback paths.

The major drawback of the ΣΔ RMS-to-DC converter architectures shown is FIGS. 7A and 7B is the presence of a systematic error proportional to $K_c$ in the converter's output. This problem can be solved if a highpass filter (HPF) is placed in series with the additional feedback path. FIGS. 10A and 10B illustrate the main possible implementations based on this concept. Equivalent implementations can be achieved when two separated feedback DACs are employed and/or the LPF and HPF are implemented in the digital domain.

Figure 11:
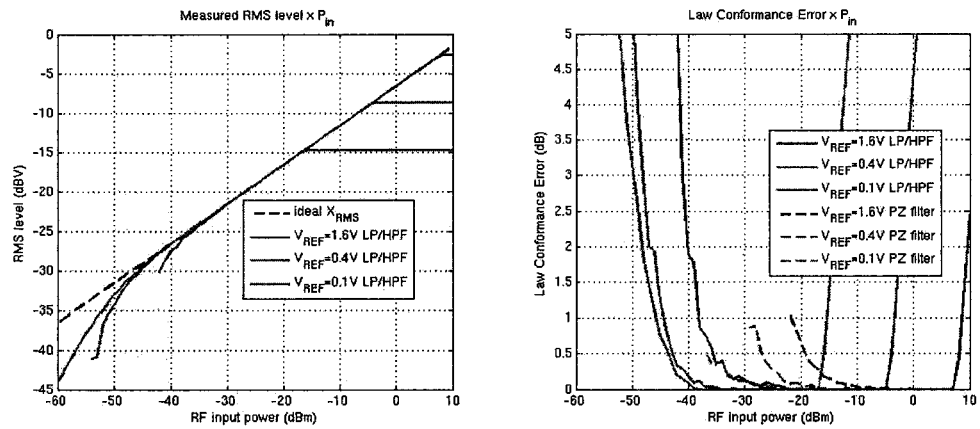
FIG. 11 depicts a simulated transfer curve and law-conformance error of the $\Sigma\Delta$ RMS-to-DC converter architectures depicted in FIGS. 10A/10B for $1^{st}$-order LPF/HPF ($f_{cHPF}=f_{cLPF}$) and $K_q=K_y/50=\beta_y^2 K_m/50$.

Based on the relation between y(t), x(t) and u(t), the large-signal static transfer of the ΣΔ difference-of-squares RMS-to-DC converters depicted in FIGS. 10A and 10B can be calculated ($A \to \infty$):

$$\lim_{A \to \infty} y_{DC} = \sqrt{\frac{K_x}{K_y}\overline{x(t)^2} - \overline{q_{lp}(t)^2}} \quad (12A)$$

$$\lim_{A \to \infty} y_{DC} = \sqrt{\frac{\beta_x^2}{\beta_y^2}\overline{x(t)^2} - \overline{q_{lp}(t)^2}} \quad (12B)$$

where $q_{lp}(t)=y_{lp}(t)-y_{DC}$ is the lowpass filtered quantization noise error, expression (12A) was obtained based on FIG. 10A and expression (12B) was obtained based on FIG. 10B. Again the RMS level of the squared quantization error is reduced by the feedback LPF. In this case however, because the additional feedback path can be considered "open" for DC signals, no systematic error proportional to the constant gain $K_q$ is added to the converter's DC transfer characteristic. The simulated transfer curve and the law-conformance error for these ΣΔ RMS-to-DC converter architectures are shown in FIG. 11 when $1^{st}$-order LPF/HPF are employed in the feedback paths and $K_q=K_y/50=\beta_y^2 K_m/50$. In this simulation, both feedback LPF and HPF have the same cut-off frequency ($f_{cHPF}=f_{cLPF}$). In comparison with FIG. 9, it is possible to notice how the law-conformance error is minimized by the addition of the feedback HPF.

Figure 3A:
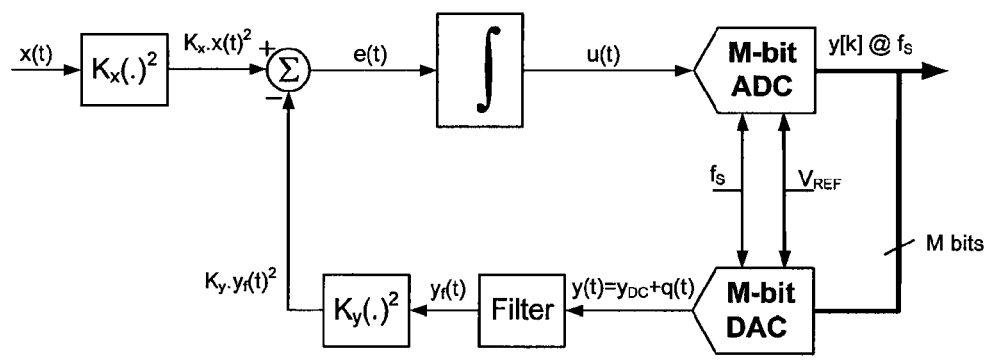
FIG. 3A depicts a $\Sigma\Delta$ difference-of-squares RMS-to-DC converter using two squaring circuits and filtering in the feedback path.
Figure 3B:
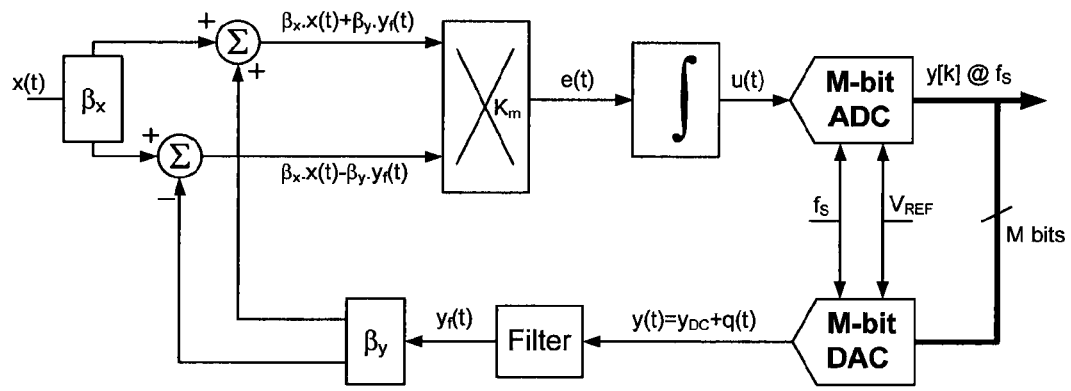
FIG. 3B depicts a $\Sigma\Delta$ difference-of-squares RMS-to-DC converter based on forward path multiplier and filtering in the feedback path.
Figure 12:
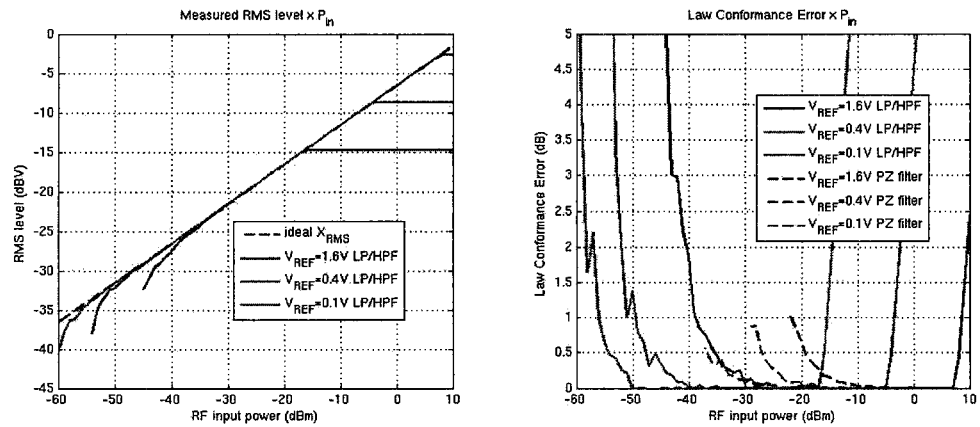
FIG. 12 depicts a simulated transfer curve and law-conformance error of the $\Sigma\Delta$ RMS-to-DC converter architectures depicted in FIGS. 10A/10B for $1^{st}$-order LPF/HPF ($f_{cHPF}=5f_{cLPF}$) and $K_q=K_y/50=\beta_y^2 K_m/50$.

FIG. 11 also shows the law-conformance error (dashed curves, right plot) for the architecture depicted in FIGS. 3A/3B when a $1^{st}$-order pole-zero filter is employed in the single feedback path (FIG. 5). Due to the additional quantization noise filtering ($\overline{q_{lp}(t)^2} < \overline{q_f(t)^2}$), the input referred DR is greatly enlarged. At low power levels and low $V_{ref}$ values however, a residual systematic error limits this improvement. This residual systematic error is not predicted by expressions (12A) and (12B), but it can be reduced by increasing the HPF cut-off frequency ($f_{cHPF}$). This residual DC error is reduced when the low-frequency attenuation through the high-frequency feedback path is increased. FIG. 12 shows the simulated transfer curve and the law-conformance error in the case $f_{cHPF}=5f_{cLPF}$. For $V_{ref}=0.1V$, the output DR is larger in FIG. 12 (compared to FIG. 11) because the residual systematic error has been reduced.

Figure 13:
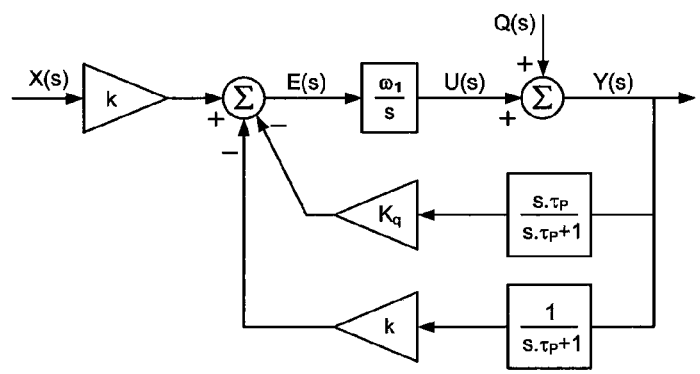
FIG. 13 depicts a $\Sigma\Delta$ difference-of-squares RMS-to-DC converter small-signal linear model for the architecture depicted in FIGS. 10A/10B with $1^{st}$-order LPF and HPF ($f_{cHPF}=f_{cLPF}$).

The small-signal AC model for this ΣΔ RMS-to-DC converter architecture is shown in FIG. 13 for the case of $1^{st}$-order feedback LPF and HPF ($f_{cHPF}=f_{cLPF}$).

Based on FIG. 13, the signal-dependent feedback loop filter $L_1(s)$ can be expressed:

$$L_1(s) = \frac{U(s)}{Y(s)} = -\frac{\omega_1}{s} \cdot \left( \frac{k + K_q \cdot s\tau_P}{s\tau_P + 1} \right) \quad (13)$$

The resulting transfer function contains 2 poles and 1 zero, and it can be designed to be conditionally stable for a certain range of input power levels ($k \propto x_{RMS}$). When the squaring non-linearity small-signal gain k equals the constant gain $K_q$, $L_1(s)$ becomes a stable $1^{st}$ order loop filter:

$$\lim_{k \to K_q} L_1(s) = -\frac{K_q \omega_1}{s} \quad (14)$$

When the input power level is very high (k→∞), $L_1(s)$ becomes an unstable $2^{nd}$-order loop filter:

$$\lim_{k \gg K_q} L_1(s) = -\frac{k\omega_1}{s} \cdot \frac{1}{s\tau_P + 1} \quad (15)$$

In the case of very small input power levels (k→0), $L_1(s)$ is a stable $1^{st}$ order loop filter with a finite DC-gain:

$$\lim_{k \ll K_q} L_1(s) = -\frac{K_q \omega_1}{s + 1/\tau_P} \quad (16)$$

Figure 14:
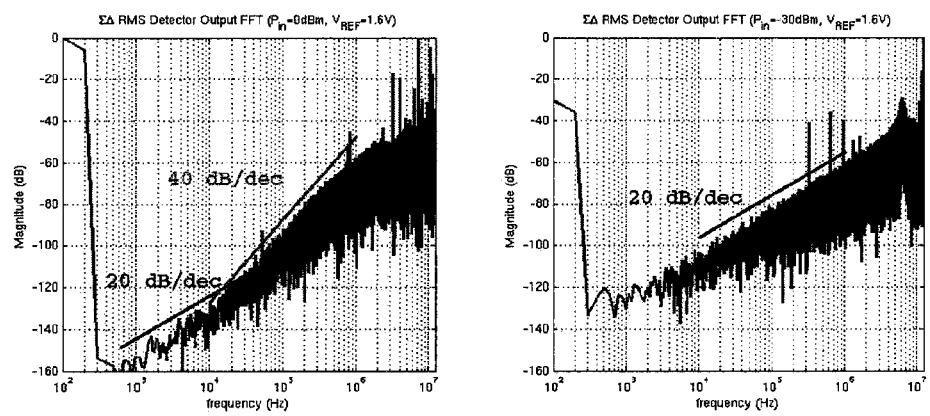
FIG. 14 depicts a simulated output spectrum of the $\Sigma\Delta$ RMS-to-DC converter architectures depicted in FIGS. 10A/10B for $1^{st}$-order LPF/HPF ($f_{cHPF}=f_{cLPF}$), $K_q=K_y/50=\beta_y^2 K_m/50$ and $P_{in}=0$ dBm or $-30$ dBm.

The simulated output spectrum of the ΣΔ RMS-to-DC converter architectures depicted in FIGS. 10A/10B is shown in FIG. 14 when $1^{st}$-order LPF/HPF are employed in the feedback paths (FIG. 13). For $P_{in}=0$ dBm, the modulator output is stable and the quantization noise presents a $2^{nd}$-order roll-off (40 dB/dec) as predicted by (13). For $P_{in}=-30$ dBm, the quantization noise presents a $1^{st}$-order roll-off (20 dB/dec) as predicted by (16)

The ΣΔ RMS-to-DC converter architectures depicted in FIGS. 10A/10B can be generalized regarding the order of the feedback filtering. The small-signal AC model in this case is shown in FIG. 15 for the case of $N^{th}$-order LPF and HPF ($f_{cHPF}=f_{cLPF}$).

Figure 15:
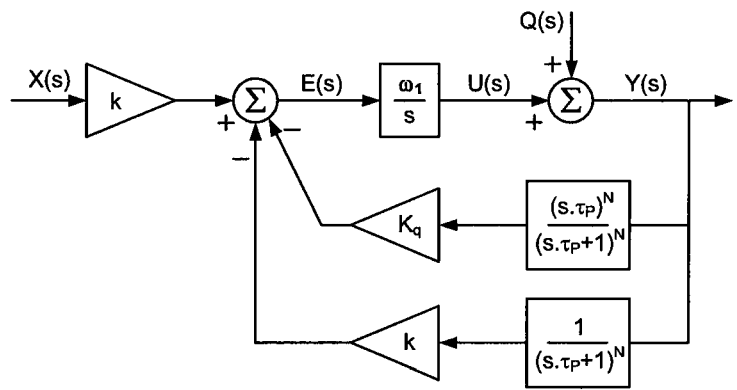
FIG. 15 depicts a $\Sigma\Delta$ difference-of-squares RMS-to-DC converter small-signal linear model for the architecture depicted in FIGS. 10A/10B with $N^{th}$-order LPF and HPF ($f_{cHPF}=f_{cLPF}$).

Based on FIG. 15, the signal-dependent feedback loop filter $L_1(s)$ can be expressed:

$$L_1(s) = \frac{U(s)}{Y(s)} = -\frac{\omega_1}{s} \cdot \left( \frac{k + K_q \cdot (s\tau_P)^N}{(s\tau_P + 1)^N} \right) \quad (17)$$

In this case however (FIG. 15), because $L_1(s)$ does not converge to a $1^{st}$-order loop filter when k→$K_q$, it is harder to design a conditionally stable $(N+1)^{th}$-order ΣΔ RMS-to-DC converter with a DR that is large enough to be practical. An alternative approach, where $L_1(s)$ is a $1^{st}$-order loop filter for k=$K_q$, is depicted FIG. 16.

Figure 16:
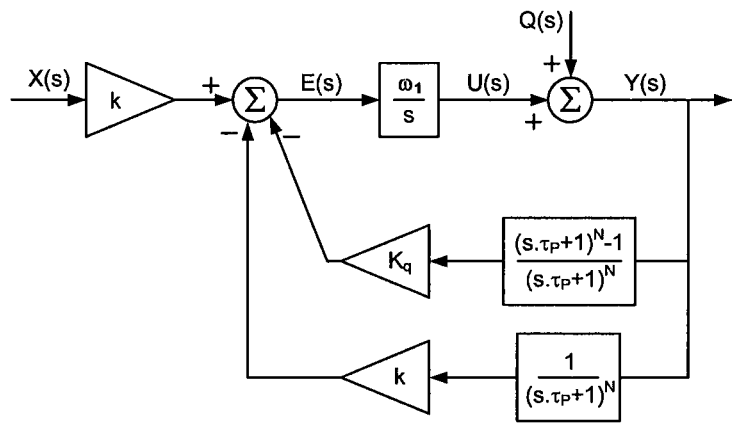
FIG. 16 depicts a $\Sigma\Delta$ difference-of-squares RMS-to-DC converter small-signal linear model for the architecture depicted in FIGS. 10A/10B with $N^{th}$-order LPF and HPF ($f_{cHPF}=f_{cLPF}$).

Based on FIG. 16, the signal-dependent feedback loop filter $L_1(s)$ can be expressed again:

$$L_1(s) = \frac{U(s)}{Y(s)} = -\frac{\omega_1}{s} \cdot \left( \frac{k + K_q \cdot (s\tau_P + 1)^N - K_q}{(s\tau_P + 1)^N} \right) \quad (18)$$

When the input power level is very high (k→∞), $L_1(s)$ becomes an unstable $(N+1)^{th}$-order loop filter:

$$\lim_{k \gg K_q} L_1(s) = -\frac{k\omega_1}{s} \cdot \frac{1}{(s\tau_P + 1)^N} \quad (19)$$

When the squaring non-linearity small-signal gain k equals the constant gain $K_q$, $L_1(s)$ is an always stable $1^{st}$-order loop filter as in (14):

$$\lim_{k \to K_q} L_1(s) = -\frac{K_q \omega_1}{s} \quad (20)$$

In the case of very small input power levels (k→0), $L_1(s)$ approaches a $1^{st}$-order loop filter when the feedback filter time-constant $\tau_p$ is large enough:

$$\lim_{k \ll K_q} L_1(s) = -\frac{K_q \omega_1}{s} \cdot \frac{(s + 1/\tau_P)^N - (1/\tau_P)^N}{(s + 1/\tau_P)^N} \quad (21)$$

The resulting loop filter transfer function $L_1(s)$ converges to a $1^{st}$-order loop filter when k≤$K_q$. As a result, the closed loop system can be designed to be conditionally stable for a certain range of input power levels ($k \propto x_{RMS}$). The LPF/HPF transfer functions, depicted as $N^{th}$-order binomials in the above calculations, can be implemented with any different set of coefficients (e.g. Butterworth, Chebyshev, etc. . . . ). In order to reduce the residual systematic error, the LPF and the HPF can have different cut-off frequencies ($f_{cHPF} \neq f_{cLPF}$) at the expense of a less stable closed loop behavior.

The ΣΔ RMS-to-DC converter architectures shown is FIGS. 10A and 10B require a LPF and a HPF in order to achieve a large input-referred DR. A similar result can be achieved with a single LPF if the additional feedback path is connected after the loop filter integrator. The small-signal AC model illustrating this situation is depicted in FIG. 17 for a $1^{st}$-order LPF.

Figure 17:
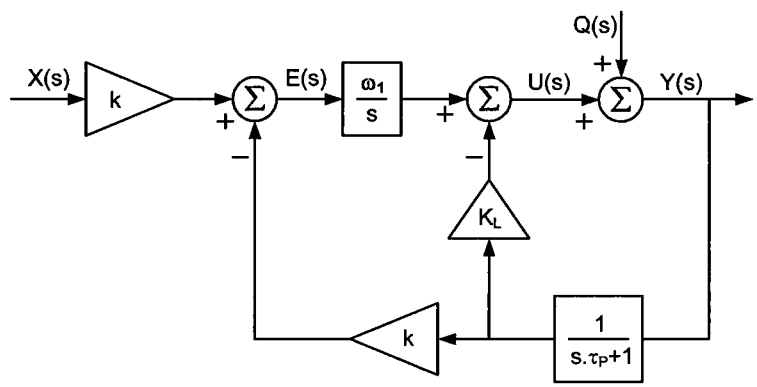
FIG. 17 depicts a $\Sigma\Delta$ difference-of-squares RMS-to-DC converter small-signal linear model for the architecture depicted in FIGS. 21A/21B.

The small-signal model in FIG. 17 can be easily obtained from the small-signal model in FIG. 13 ($f_{cHPF}=f_{cLPF}$). Based on FIG. 17, the signal-dependent feedback loop filter $L_1(s)$ can be expressed:

$$L_1(s) = \frac{U(s)}{Y(s)} = -\frac{\omega_1}{s} \cdot \left( \frac{k + s \cdot K_L/\omega_1}{s\tau_P + 1} \right) \quad (22)$$

where $K_L = K_q \omega_1 \tau_P$. The resulting transfer function contains 2 poles and 1 zero, and it can be designed to be conditionally stable for a certain range of input power levels ($k \propto x_{RMS}$). When the input power level is very high ($k \to \infty$), $L_1(s)$ becomes an unstable $2^{nd}$-order loop filter:

$$\lim_{k \gg K_q} L_1(s) = -\frac{k\omega_1}{s} \cdot \frac{1}{s\tau_P + 1} \quad (23)$$

When the squaring non-linearity small-signal gain k equals $K_L/(\omega_1 \tau_P)$, $L_1(s)$ is a stable $1^{st}$ order loop filter:

$$\lim_{k \to K_q} L_1(s) = -\frac{K_L/\tau_P}{s} \quad (24)$$

In the case of very small input power levels ($k \to 0$), $L_1(s)$ becomes a stable $1^{st}$ order loop filter with a finite DC-gain:

$$\lim_{k \ll K_q} L_1(s) = -\frac{K_L/\tau_P}{s + 1/\tau_P} \quad (25)$$

Figure 18:
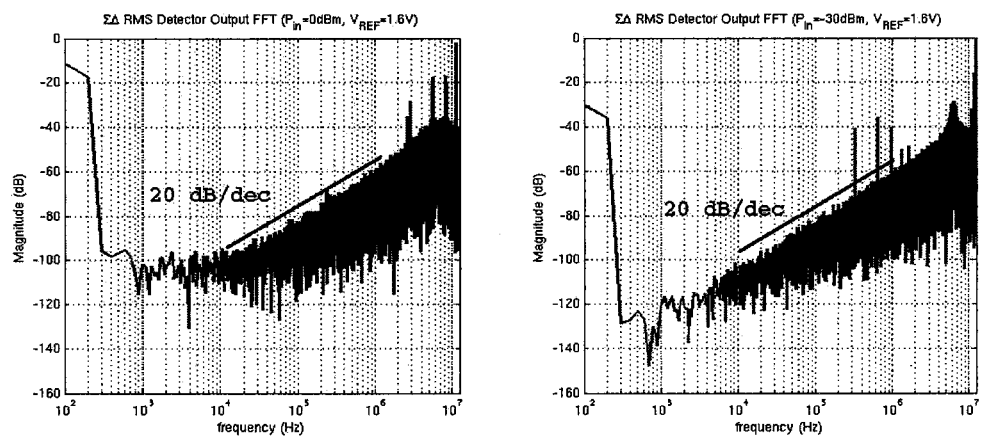
FIG. 18 depicts a simulated output spectrum of the $\Sigma\Delta$ RMS-to-DC converter architectures depicted in FIGS. 21A/21B for $1^{st}$-order LPF, $K_L=16K_y=\beta_y^2 K_m$ and $P_{in}=0$ dBm or $-30$ dBm.
Figure 19:
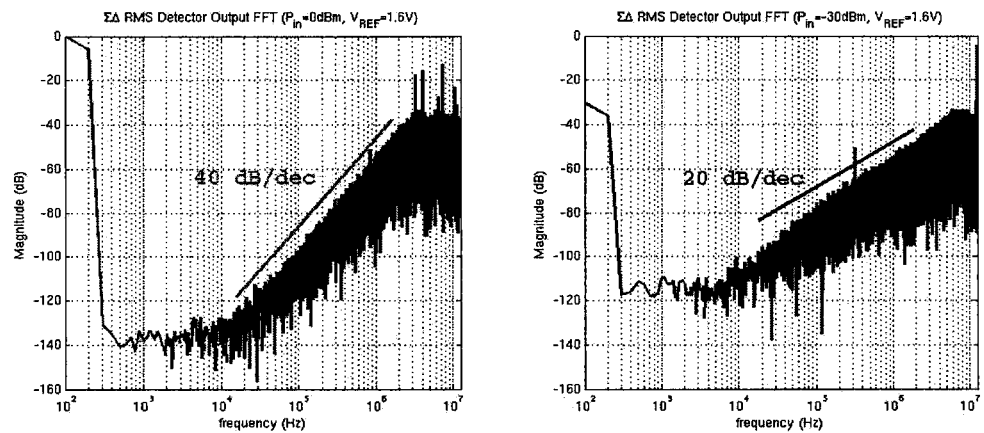
FIG. 19 depicts a simulated output spectrum of the ΣΔ RMS-to-DC converter architectures depicted in FIGS. 21A/21B for $1^{st}$-order LPF, $K_L=4K_y=4\beta_y^2 K_m$ and $P_{in}=0$ dBm or −30 dBm.
Figure 20:
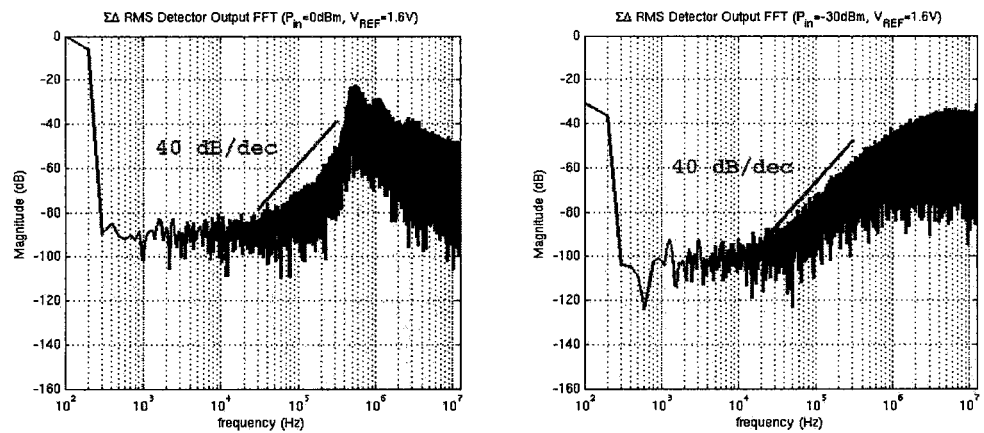
FIG. 20 depicts a simulated output spectrum of the ΣΔ RMS-to-DC converter architectures depicted in FIGS. 21A/21B for $1^{st}$-order LPF, $K_L=K_y=\beta_y^2 K_m$ and $P_{in}=0$ dBm or −30 dBm.

The simulated output spectrum of the ΣΔ RMS-to-DC converter architecture depicted in FIG. 17 (also in FIGS. 21A/21B) is shown in FIGS. 18, 19 and 20 when a $1^{st}$-order LPF is employed in the feedback path. For the simulation results shown in FIG. 18, $K_L=16K_y$ and $L_1(s)$ is a $1^{st}$-order loop filter (20 dB/dec roll-off) for the whole range of input power levels as predicted by (24) and (25). However, as can be seen in the plot for $P_{in}=0$ dBm, the measured RMS voltage (DC level) is below −10 dB and consequently the law-conformance error is very large (see also FIG. 22).

FIG. 19 shows the simulation results obtained with $K_L=4K_y$. For $P_{in}=0$ dBm, the modulator output is stable and the quantization noise presents a $2^{nd}$-order roll-off (40 dB/dec) as predicted by (22). In this case, the output DC level is 0 dB and consequently the law-conformance error is very small (see also FIG. 22). For $P_{in}=-30$ dBm, the quantization noise presents a $1^{st}$-order roll-off (20 dB/dec) as predicted by (25)

For the simulation results shown in FIG. 20, $K_L=K_y$ and $L_1(s)$ is a $2^{nd}$-order loop filter (40 dB/dec roll-off) for the whole range of input power levels as predicted by (22) and (23). However, as can be seen in the plot for $P_{in}=0$ dBm, the ΣΔ RMS-to-DC converter approaches an unstable behavior.

Figure 21A:
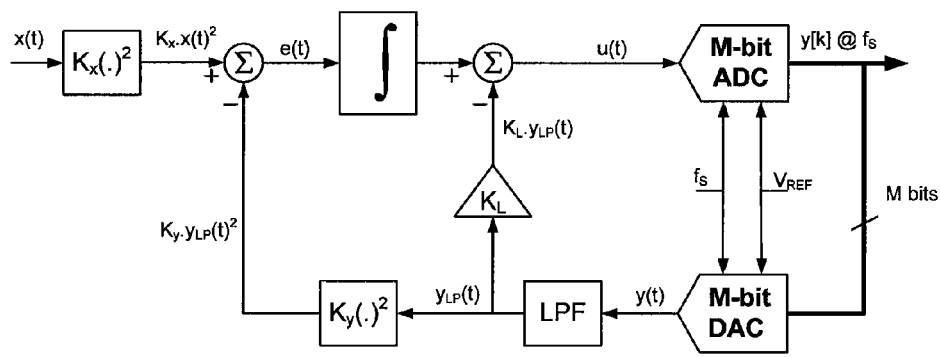
FIG. 21A depicts a ΣΔ difference-of-squares RMS-to-DC converter using two squaring circuits with lowpass filtered feedback paths.
Figure 21B:
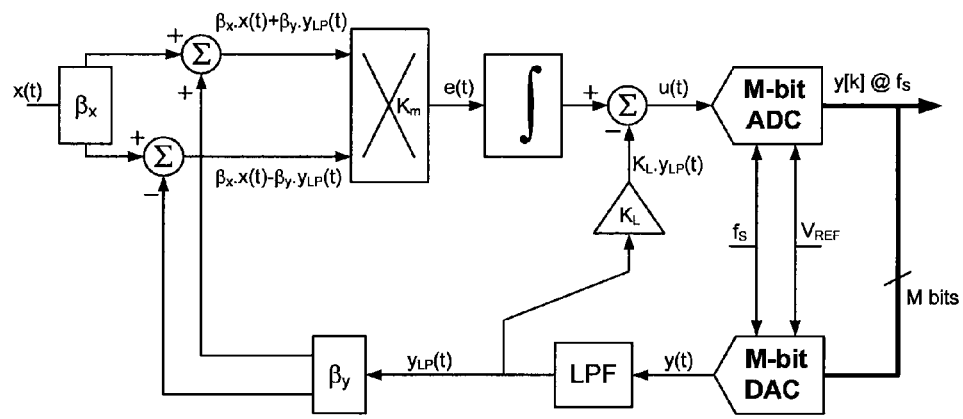
FIG. 21B depicts a ΣΔ difference-of-squares RMS-to-DC converter based on forward path multiplier with lowpass filtered feedback paths.

The parameter $K_L$, the gain factor of the constant feedback path in FIGS. 17 and 21A/21B, controls the trade-off between DC accuracy and stability. For $K_L \gg K_y$, the closed-loop system is very stable but the law-conformance error is degraded for high input-power levels. For $K_L \to K_y$, the closed-loop system is closer to instability but the law-conformance error is very small for high input-power levels FIGS. 21A and 21B show the main possible implementations of a ΣΔ difference-of-squares RMS-to-DC converter based on the linearized closed loop system in FIG. 17. Equivalent implementations can be achieved when two separated sets of feedback DAC/LPF are employed and/or the LPF(s) is(are) implemented in the digital domain.

Figure 22:
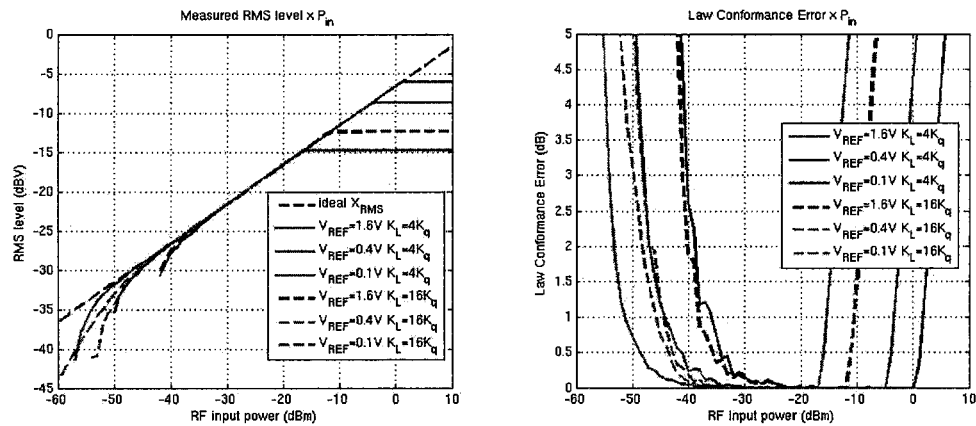
FIG. 22 depicts a simulated transfer curve and law-conformance error of the ΣΔ RMS-to-DC converter architectures depicted in FIGS. 21A/21B for a $1^{st}$-order LPF and $K_L=4K_y$ or $16K_y$.

Based on the relation between y(t), x(t) and u(t), the large-signal static transfer of the ΣΔ difference-of-squares RMS-to-DC converters in FIGS. 21A/21B can be calculated:

$$y_{DC} = \frac{-(1+K_L)}{2AK_y} + \sqrt{\left(\frac{1+K_L}{2AK_y}\right)^2 + \frac{K_x}{K_y}\overline{x(t)^2} - \overline{q_{lp}(t)^2}} \quad (26A)$$

$$y_{DC} = \frac{-(1+K_L)}{2AK_m\beta_y^2} + \sqrt{\left(\frac{1+K_L}{2AK_m\beta_y^2}\right)^2 + \frac{\beta_x^2}{\beta_y^2}\overline{x(t)^2} - \overline{q_{lp}(t)^2}} \quad (26B)$$

where A is the actual integrator DC-gain, $q_{lp}(t)=y_{lp}(t)-y_{DC}$ is the lowpass filtered quantization noise error, expression (26A) was obtained based on FIG. 21A and expression (26B) was obtained based on FIG. 21B. Again the RMS level of the squared quantization error is reduced by the feedback LPF. In this case however, because the additional feedback path can be considered a "short" for DC signals, a systematic error proportional to the ratio $K_L/AK_y=K_L/AK_m\beta_y^2$ is added to the converter's DC transfer characteristic. The simulated transfer curve and the law-conformance error for this ΣΔ RMS-to-DC converter architecture are shown in FIG. 22 for $K_L/K_y=4$ and $K_L/K_y=16$. In the first case, the output DR was greatly enlarged compared to FIG. 9. In the second case however, at low power levels and low $V_{ref}$ values this improvement is reduced by the systematic error proportional to $K_L/K_y$. The maximum detectable input power level is also reduced for $K_L/K_y=16$.

Figure 23:
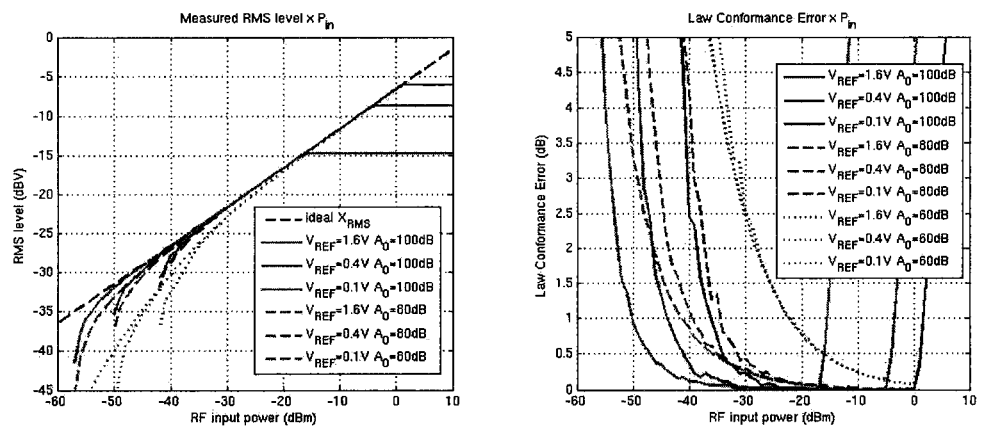
FIG. 23 depicts a simulated transfer curve and law-conformance error of the ΣΔ RMS-to-DC converter architectures depicted in FIGS. 21A/21B for $K_L=4K_y$ and A=100 dB, 80 dB or 60 dB.

All simulation results presented in FIGS. 18, 19, 20 and 22 were obtained with an ideal integrator model ($A=\infty$). However, the residual DC error in expressions (26A) and (26B) is inversely proportional to the integrator actual finite DC-gain A. FIG. 23 shows the simulated transfer curves and the law-conformance error for $K_L/K_y=4$ and $A=100$ dB, 80 dB or 60 dB.

As predicted by expressions (26A) and (26B), the output DR is maximized for $A \to \infty$. For low values of A the systematic DC component, not the quantization error mean square value, is the dominant error source in the law conformance error plots.

The ΣΔ RMS-to-DC converter architecture depicted in FIGS. 17, 21A and 21B can be generalized in order to have multiple feedback paths and $N^{th}$-order lowpass filtering in the low-frequency path connected to the squaring non-linearity. The small-signal AC model illustrating this situation is depicted in FIG. 24.

Figure 24:
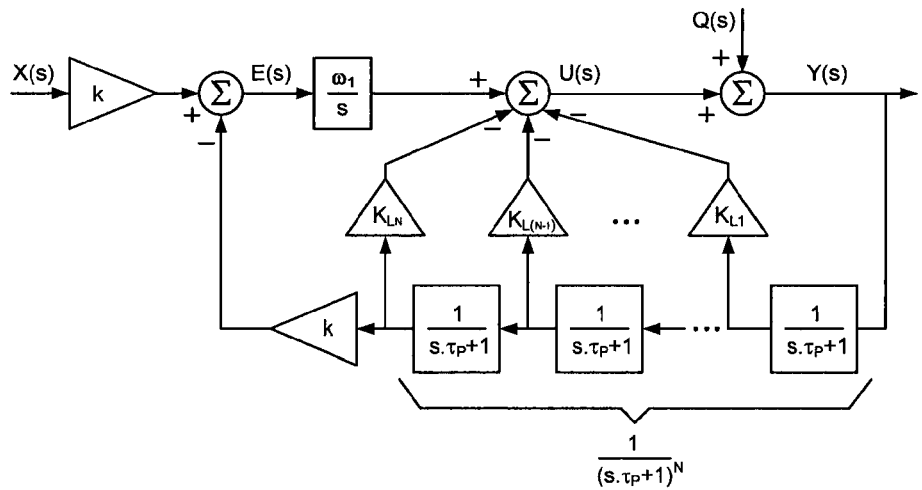
FIG. 24 depicts a ΣΔ difference-of-squares RMS-to-DC converter small-signal linear model with multiple lowpass filtered feedback paths.

When the coefficients $K_{Li}$ are equal to $K_q \omega_1 \tau_P$, the feedback loop filter transfer function $L_1(s)$ for the architecture in FIG. 24 is the same as obtained with the architecture in FIG. 16. In this case, expressions (18) to (21) are equally valid for the architecture with multiple lowpass filtered feedback paths as the resulting loop filter transfer function $L_1(s)$ converges to a $1^{st}$-order loop filter when $k \leq K_{Li}/\omega_1 \tau_P$ and $\tau_P$ is large enough. As a result, the closed loop system can be designed to be conditionally stable for a certain range of input power levels ($k \propto x_{RMS}$).

Figure 25A:
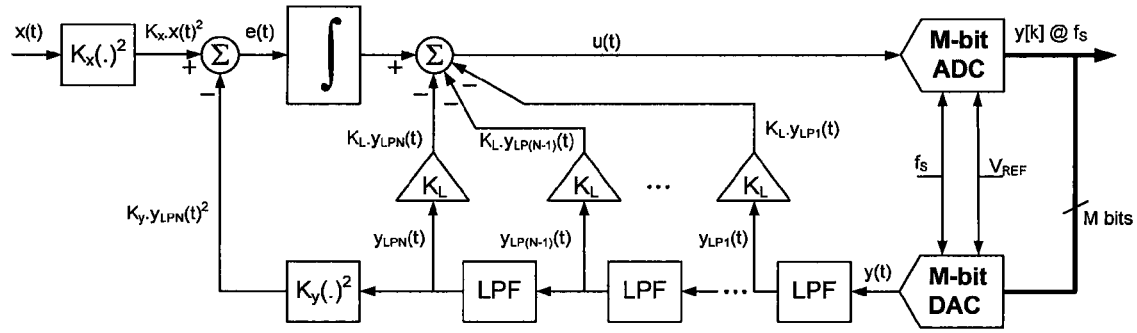
FIG. 25A depicts a ΣΔ difference-of-squares RMS-to-DC converter using two squaring circuits with multiple lowpass filtered feedback paths.
Figure 25B:
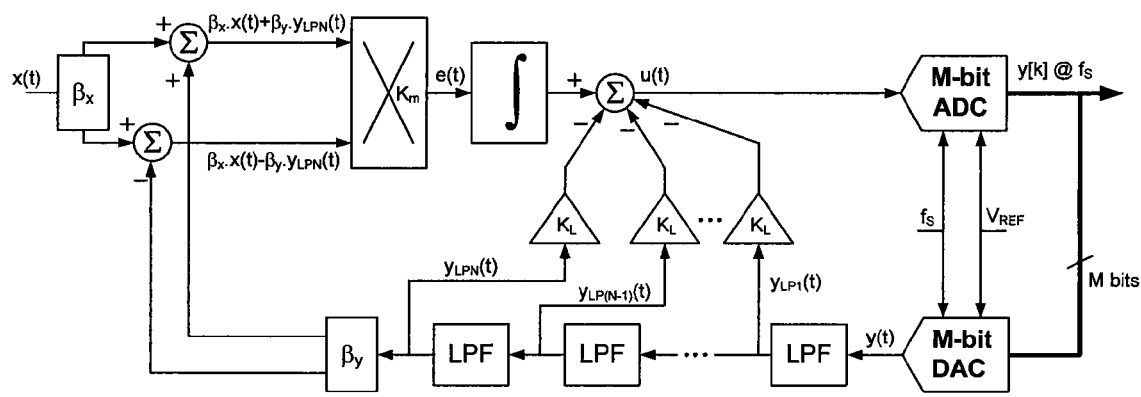
FIG. 25B depicts a ΣΔ difference-of-squares RMS-to-DC converter based on forward path multiplier with multiple lowpass filtered feedback paths.

FIGS. 25A and 25B show the main possible implementations of a $\Sigma\Delta$ difference-of-squares RMS-to-DC converter based on the linearized closed loop system in FIG. 24. Equivalent implementations can be achieved when multiple separated sets of feedback DAC/LPF are employed and/or the LPFs are implemented in the digital domain.

Based on the relation between y(t), x(t) and u(t), the large-signal static transfer of the $\Sigma\Delta$ difference-of-squares RMS-to-DC converters in FIGS. 25A/25B can be calculated:

$$y_{DC} = \frac{-(1+N \cdot K_L)}{2AK_y} + \sqrt{\left(\frac{1+N \cdot K_L}{2AK_y}\right)^2 + \frac{K_x}{K_y}\overline{x(t)^2} - \overline{q_{lpN}(t)^2}} \quad (27A)$$

$$y_{DC} = \frac{-(1+N \cdot K_L)}{2AK_m \beta_y^2} + \sqrt{\left(\frac{1+N \cdot K_L}{2AK_m \beta_y^2}\right)^2 + \frac{\beta_x^2}{\beta_y^2}\overline{x(t)^2} - \overline{q_{lpN}(t)^2}} \quad (27B)$$

where A is the actual integrator DC-gain, $K_L = K_q \omega_1 \tau_P$, $q_{lpN}(t) = y_{lpN}(t) - y_{DC}$ is the $N^{th}$-order lowpass filtered quantization noise error, expression (27A) was obtained based on FIG. 25A and expression (27B) was obtained based on FIG. 25B. The DC solution obtained for the generalized architecture is very similar to the case where a single $1^{st}$-order LPF is employed (FIGS. 21A/21B), with two major differences. First, the quantization error mean-square value is attenuated by an $N^{th}$-order LPF. Second, a residual systematic error proportional to the ratio $NK_L/AK_y = NK_L/AK_m \beta_y^2$ is added to the converter's DC transfer characteristic. Therefore, a trade-off exists between the reduction of the quantization error mean-square value and the increase of the residual systematic error.

All architectures described above can be implemented with multiple integrators. In this case however, the $\Sigma\Delta$ RMS-to-DC converter's forward path also needs to be stabilized with high-frequency zeros. Several architectures are described herein where the frequency compensation is implemented with multiple forward paths.

Figure 26A:
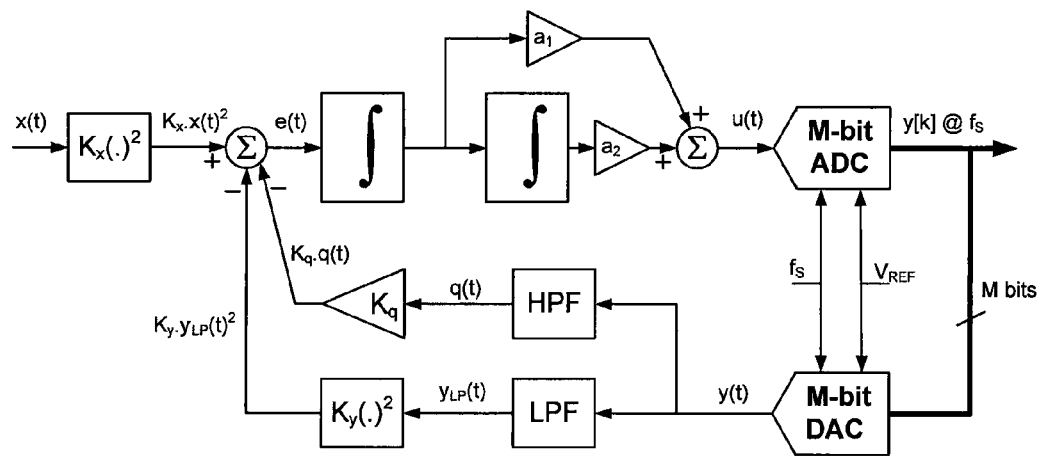
FIG. 26A depicts a ΣΔ difference-of-squares RMS-to-DC converter using two squaring circuits with two integrators (feedforward compensation) and, lowpass and highpass filtered feedback paths.
Figure 26B:
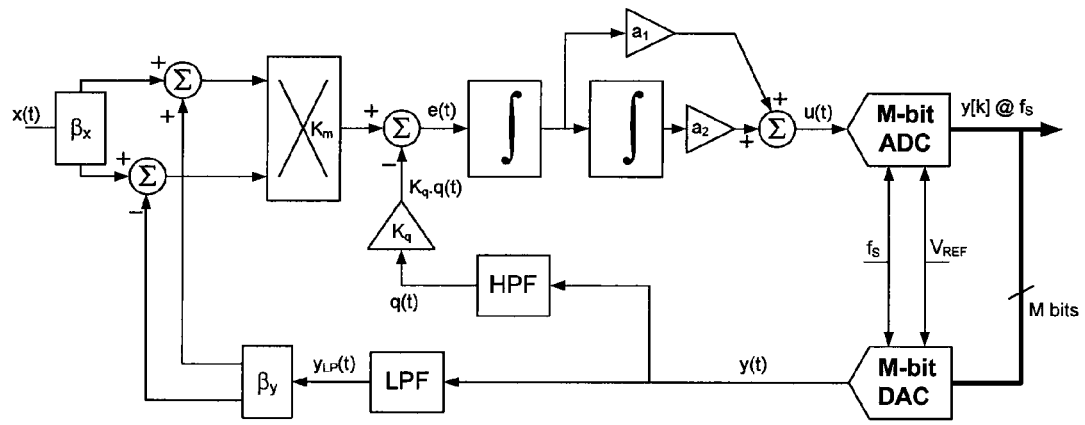
FIG. 26B depicts a ΣΔ difference-of-squares RMS-to-DC converter based on forward path multiplier with two integrators (feedforward compensation) and, lowpass and highpass filtered feedback paths.

The feedforward compensated loop filter can be combined with lowpass and highpass filtered feedback paths, or with lowpass filtered and constant-gain feedback paths. FIGS. 26A and 26B illustrate the main possible implementations based on this concept. Equivalent implementations can be achieved when more than two integrators are employed, the highpass filtered feedback path is replaced by a constant-gain ($K_c$) path, two separated feedback DACs are employed and/or the LPF and HPF are implemented in the digital domain.

Based on the relation between y(t), x(t) and u(t), the large-signal static transfer of the $\Sigma\Delta$ difference-of-squares RMS-to-DC converters in FIGS. 26A/26B can be calculated:

$$y_{DC} = \frac{-1}{2A_{FF}K_y} + \sqrt{\left(\frac{1}{2A_{FF}K_y}\right)^2 + \frac{K_x}{K_y}\overline{x(t)^2} - \overline{q_{lp}(t)^2}} \quad (28A)$$

$$y_{DC} = \frac{-1}{2A_{FF}K_m\beta_y^2} + \sqrt{\left(\frac{1}{2A_{FF}K_m\beta_y^2}\right)^2 + \frac{\beta_x^2}{\beta_y^2}\overline{x(t)^2} - \overline{q_{lp}(t)^2}} \quad (28B)$$

$$A_{FF} = A_1(a_1 + a_2 A_2) \quad (29)$$

where $A_{FF}$ is the combined DC-gain of the integrators stabilized with feedforward paths, $A_1$ is the actual DC-gain of the $1^{st}$-integrator, $A_2$ is the actual DC-gain of the $2^{nd}$-integrator, $a_i$ are the feedforward coefficients, $q_{lp}(t) = y_{lp}(t) - y_{DC}$ is the lowpass filtered quantization noise error, expression (28A) was obtained based on FIG. 26A and expression (28B) was obtained based on FIG. 26B. The main advantage of employing multiple integrators in the feedforward path is to increase the attenuation of the systematic component in expressions (28A)/(28B).

Figure 27:
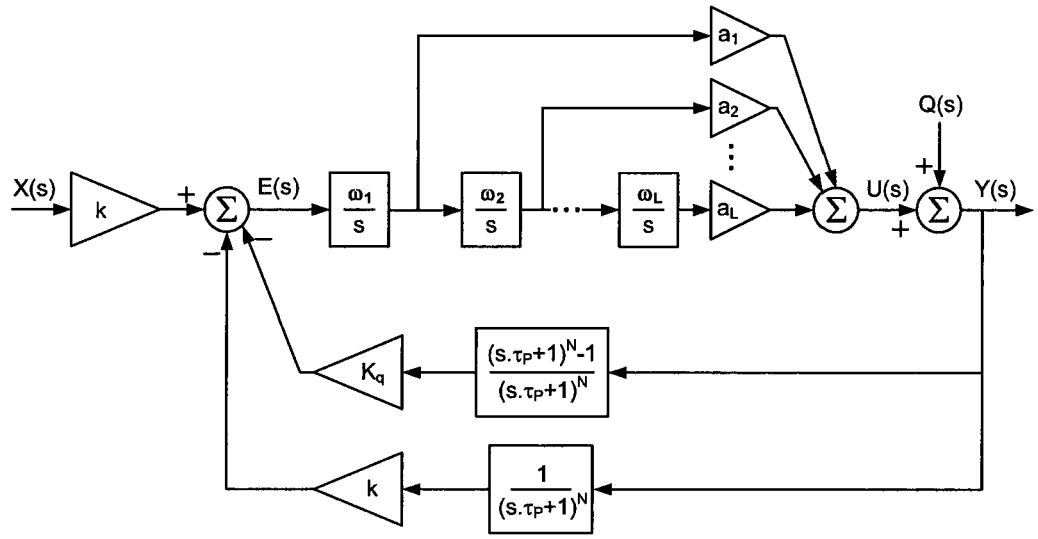
FIG. 27 depicts a ΣΔ difference-of-squares RMS-to-DC converter small-signal linear model with L integrators (feedforward compensation) and $N^{th}$-order feedback LPF/HPF.

FIG. 27 shows the generalized AC small-signal model for the architecture depicted in FIGS. 26A/26B. This closed loop system with L integrators and $N^{th}$-order feedback LPF/HPF is characterized by a $(L+N)^{th}$-order noise shaping.

Based on FIG. 27, the signal-dependent feedback loop filter $L_1(s)$ can be expressed again:

$$L_1(s) = \frac{U(s)}{Y(s)} = -\left(\frac{s^{L-1}a_1\omega_1 + s^{L-2}a_2\omega_2\omega_1 + \ldots + a_L\prod_{i=1}^{L}\omega_i}{s^L}\right) \cdot \left(\frac{k + K_q \cdot (s\tau_P+1)^N - K_q}{(s\tau_P+1)^N}\right) \quad (30)$$

The resulting loop filter transfer function $L_1(s)$ converges to an $L^{th}$-order stable loop filter when $k \leq K_q$. As a result, the closed loop system can be designed to be conditionally stable for a certain range of input power levels ($k \propto x_{RMS}$). The LPF/HPF transfer functions, depicted as $N^{th}$-order binomials in FIG. 27, can be implemented with any different set of coefficients (e.g. Butterworth, Chebyshev, etc. . . . ) and with different cut-off frequencies ($f_{cHPF} \neq f_{cLPF}$) at the expense of a less stable closed loop behavior.

Figure 28A:
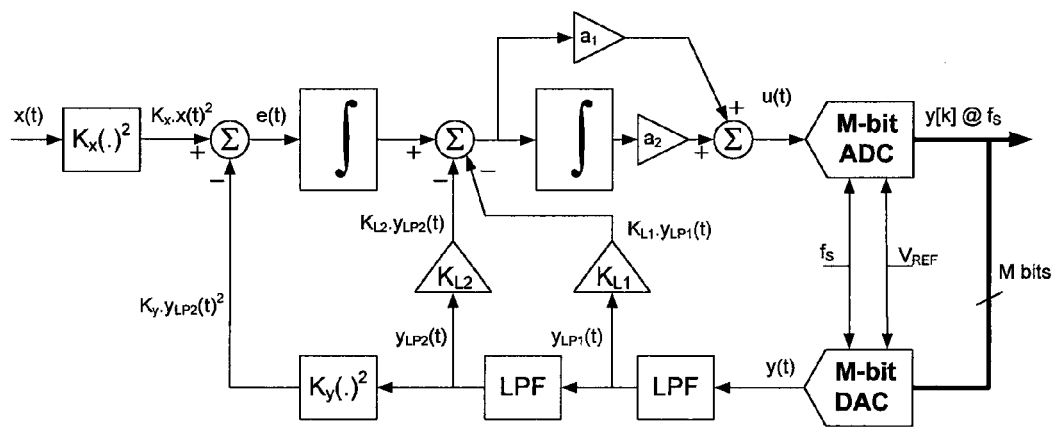
FIG. 28A depicts a ΣΔ difference-of-squares RMS-to-DC converter using two squaring circuits with two integrators (feedforward compensation) and lowpass filtered feedback paths.
Figure 28B:
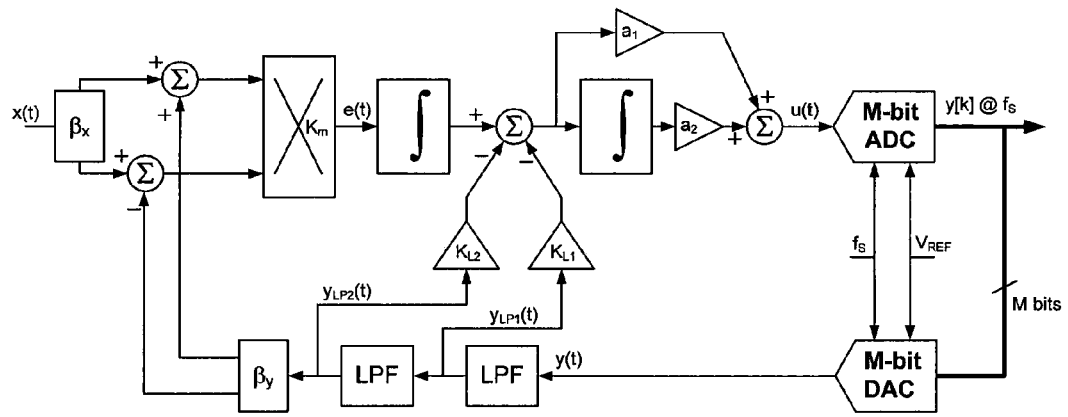
FIG. 28B depicts a ΣΔ difference-of-squares RMS-to-DC converter based on forward path multiplier with two integrators (feedforward compensation) and lowpass filtered feedback paths.

The feedforward compensated loop filter can be combined with multiple lowpass filtered feedback paths. FIGS. 28A and 28B illustrate the main possible implementations based on this concept. Equivalent implementations can be achieved when more than two integrators are employed, more than two LPFs are employed, multiple feedback DACs are employed and/or the LPFs are implemented in the digital domain.

Based on the relation between y(t), x(t) and u(t), the large-signal static transfer of the $\Sigma\Delta$ difference-of-squares RMS-to-DC converters in FIGS. 28A/28B can be calculated:

$$y_{DC} = \frac{-\left(\frac{1}{A_{FF}} + \frac{K_{L1}+K_{L2}}{A_1}\right)}{2K_y} + \sqrt{\frac{\left(\frac{1}{A_{FF}} + \frac{K_{L1}+K_{L2}}{A_1}\right)^2}{4K_y^2} + \frac{K_x}{K_y}\overline{x(t)^2} - \overline{q_{lp2}(t)^2}} \quad (31A)$$

-continued $$y_{DC} = \frac{-\left(\frac{1}{A_{FF}} + \frac{K_{L1} + K_{L2}}{A_1}\right)}{2K_m\beta_y^2} + \sqrt{\frac{\left(\frac{1}{A_{FF}} + \frac{K_{L1} + K_{L2}}{A_1}\right)^2}{4K_m^2\beta_y^4} + \frac{\beta_x^2}{\beta_y^2}\overline{x(t)^2} - \overline{q_{lp2}(t)^2}} \quad (31B)$$

where $A_{FF}$ is the combined DC-gain of the integrators stabilized with feedforward paths, $A_1$ is the actual DC-gain of the $1^{st}$-integrator, $q_{lp2}(t)=y_{lp2}(t)-y_{DC}$ is the lowpass filtered quantization noise error, expression (31A) was obtained based on FIG. 28A and expression (31B) was obtained based on FIG. 28B. Besides the fact that this architecture can employ multiple integrators in the feedforward path, the systematic error component proportional to $K_{L1}+K_{L2}$ ( ... +$K_{LN}$) is only attenuated by the gain $A_1$ of the $1^{st}$-integrator.

Figure 29:
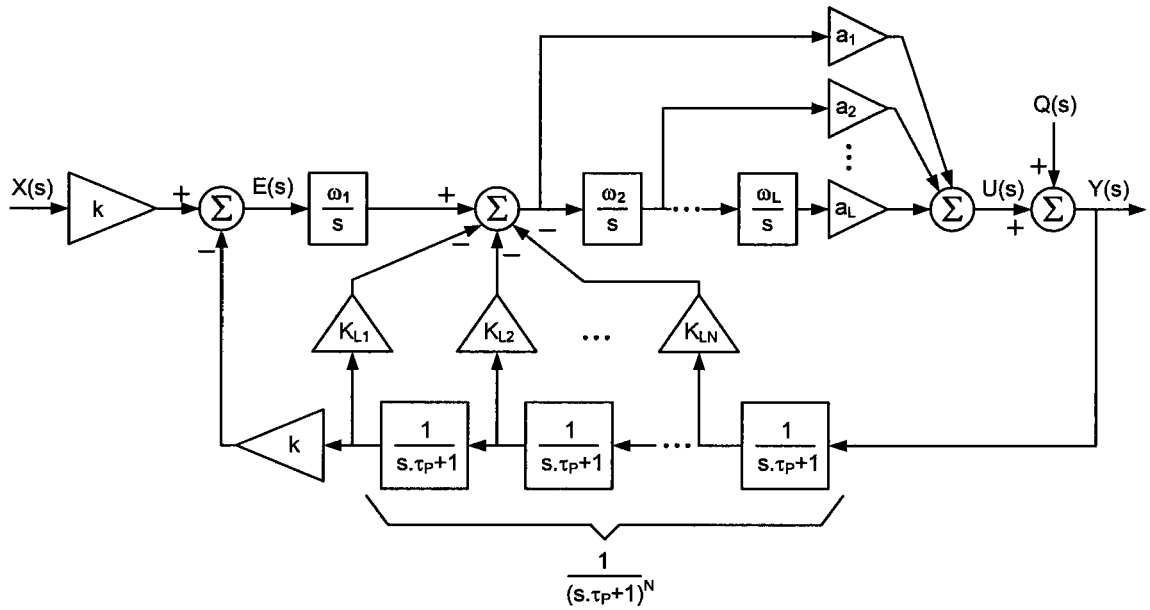
FIG. 29 depicts a ΣΔ difference-of-squares RMS-to-DC converter small-signal linear model with L integrators (feedforward compensation) and $N^{th}$-order feedback LPF.

FIG. 29 shows the generalized AC small-signal model for the architecture depicted in FIGS. 28A/28B. This closed loop system with L integrators and $N^{th}$-order feedback LPF is characterized by a $(L+N)^{th}$-order noise shaping.

When the coefficients $K_{Li}$ are equal to $K_q\omega_1\tau_P$, the feedback loop filter transfer function $L_1(s)$ for the architecture in FIG. 29 is the same as obtained with the architecture in FIG. 27. In this case, expression (30) is equally valid for the architecture with multiple lowpass filtered feedback paths and the resulting loop filter transfer function $L_1(s)$ converges to an $L^{th}$-order loop filter when $k \leq K_{Li}/\omega_1\tau_P$. As a result, the closed loop system can be designed to be conditionally stable for a certain range of input power levels ($k \propto x_{RMS}$).

Figure 30A:
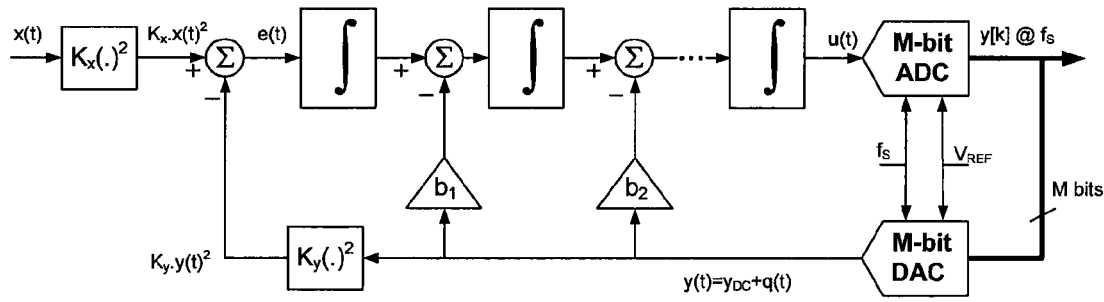
FIG. 30A depicts a ΣΔ difference-of-squares RMS-to-DC converter using two squaring circuits with L integrators (feedback compensation).
Figure 30B:
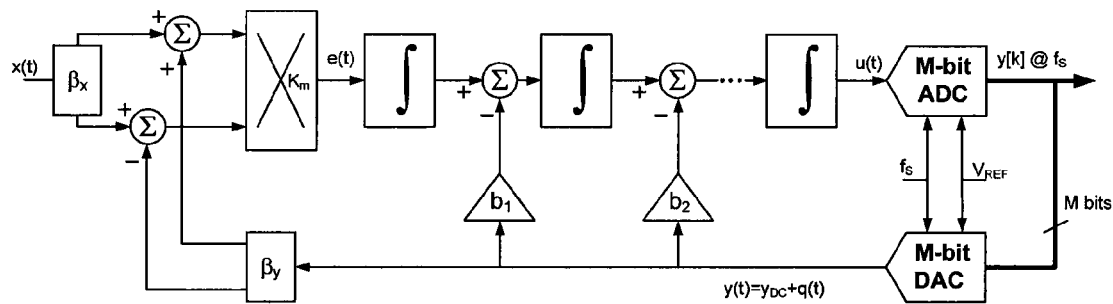
FIG. 30B depicts a ΣΔ difference-of-squares RMS-to-DC converter based on forward path multiplier with L integrators (feedback compensation).

All architectures described above can be implemented with multiple integrators. In this case however, the $\Sigma\Delta$ RMS-to-DC converter's forward path also needs to be stabilized with high frequency zeros. Several architectures are described herein where the frequency compensation is implemented with multiple feedback paths. The basic $L^{th}$-order feedback-compensated $\Sigma\Delta$ RMS-to-DC converter is depicted in FIGS. 30A/30B. In order to decrease the quantization noise power being squared, a LPF or a pole-zero filter can be placed before the feedback squaring non-linearity (as in FIGS. 3A/3B).

Based on the relation between y(t), x(t) and u(t), the large-signal static transfer of the $\Sigma\Delta$ difference-of-squares RMS-to-DC converters in FIGS. 30A/30B can be calculated:

$$y_{DC} = \frac{-\left(1 + b_{L-1}A_L + \ldots + b_1\prod_{i=2}^{L} A_i\right)}{2A_{FB}K_y} + \sqrt{\left(\frac{1 + b_{L-1}A_L + \ldots + b_1\prod_{i=2}^{L} A_i}{2A_{FB}K_y}\right)^2 + \frac{K_x}{K_y}\overline{x(t)^2} - \overline{q(t)^2}} \quad (32A)$$

$$y_{DC} = \frac{-\left(1 + b_{L-1}A_L + \ldots + b_1\prod_{i=2}^{L} A_i\right)}{2A_{FB}K_m\beta_y^2} + \sqrt{\left(\frac{1 + b_{L-1}A_L + \ldots + b_1\prod_{i=2}^{L} A_i}{2A_{FB}K_m\beta_y^2}\right)^2 + \frac{\beta_x^2}{\beta_y^2}\overline{x(t)^2} - \overline{q(t)^2}} \quad (32B)$$

$$A_{FB} = A_1 \cdot A_2 \cdot \ldots \cdot A_L \quad (33)$$

where $A_{FB}$ is the product of all integrators' DC-gains, $A_i$ is the actual DC-gain of the $i_{th}$-integrator and $b_i$ are the feedback coefficients. In this architecture, corresponds to each additional integrator a component of the residual systematic error due to the required feedback path. The systematic error due to the $l^{th}$ integrator (l>1) is given by:

$$\frac{b_{l-1}\prod_{j=l}^{L} A_l}{2A_{FB}K_y} = \frac{b_{l-1}\prod_{j=l}^{L} A_l}{2A_{FB}K_m\beta_y^2} \quad (34)$$

Figure 31A:
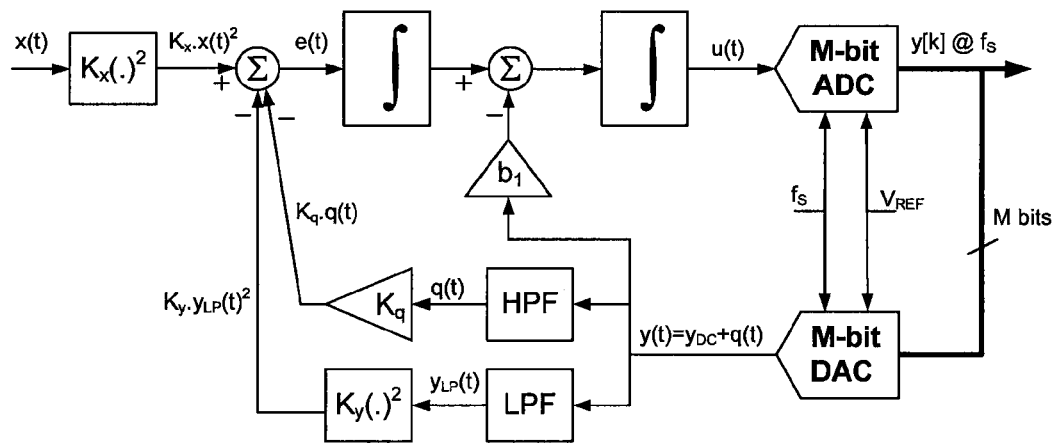
FIG. 31A depicts a ΣΔ difference-of-squares RMS-to-DC converter using two squaring circuits with two integrators (feedback compensation) and, lowpass and highpass filtered feedback paths.
Figure 31B:
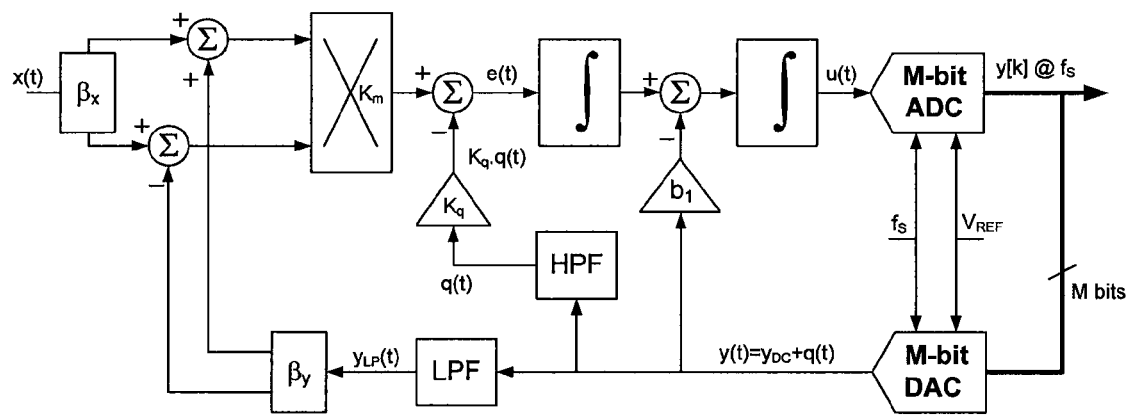
FIG. 31B depicts a ΣΔ difference-of-squares RMS-to-DC converter based on forward path multiplier with two integrators (feedback compensation) and, lowpass and highpass filtered feedback paths.

The feedback compensated loop filter can be combined with lowpass and highpass filtered feedback paths, or with lowpass filtered and constant-gain feedback paths. FIGS. 31A and 31B illustrate the main possible implementations based on this concept. Equivalent implementations can be achieved when more than two integrators are employed, the highpass filtered feedback path is replaced by a constant-gain ($K_c$) path, two separated feedback DACs are employed and/or the LPF and HPF are implemented in the digital domain.

Based on the relation between y(t), x(t) and u(t), the large-signal static transfer of the $\Sigma\Delta$ difference-of-squares RMS-to-DC converters in FIGS. 31A/31B can be calculated:

$$y_{DC} = \frac{-(1 + A_2b_1)}{2A_{FB}K_y} + \sqrt{\left(\frac{1 + A_2b_1}{2A_{FB}K_y}\right)^2 + \frac{K_x}{K_y}\overline{x(t)^2} - \overline{q_{lp}(t)^2}} \quad (35A)$$

$$y_{DC} = \frac{-(1 + A_2b_1)}{2A_{FB}K_m\beta_y^2} + \sqrt{\left(\frac{1 + A_2b_1}{2A_{FB}K_m\beta_y^2}\right)^2 + \frac{\beta_x^2}{\beta_y^2}\overline{x(t)^2} - \overline{q_{lp}(t)^2}} \quad (35B)$$

where $A_{FB}=A_1A_2$ is the combined DC-gain of the integrators stabilized with feedback paths, $A_1$ is the actual DC-gain of the $1^{st}$-integrator, $A_2$ is the actual DC-gain of the $2^{nd}$-integrator, $b_1$ and $K_q$ are the feedback coefficients, $q_{lp}(t)=y_{lp}(t)-y_{DC}$ is the lowpass filtered quantization noise error, expression (35A) was obtained based on FIG. 31A and expression (35B) was obtained based on FIG. 31B.

Figure 32:
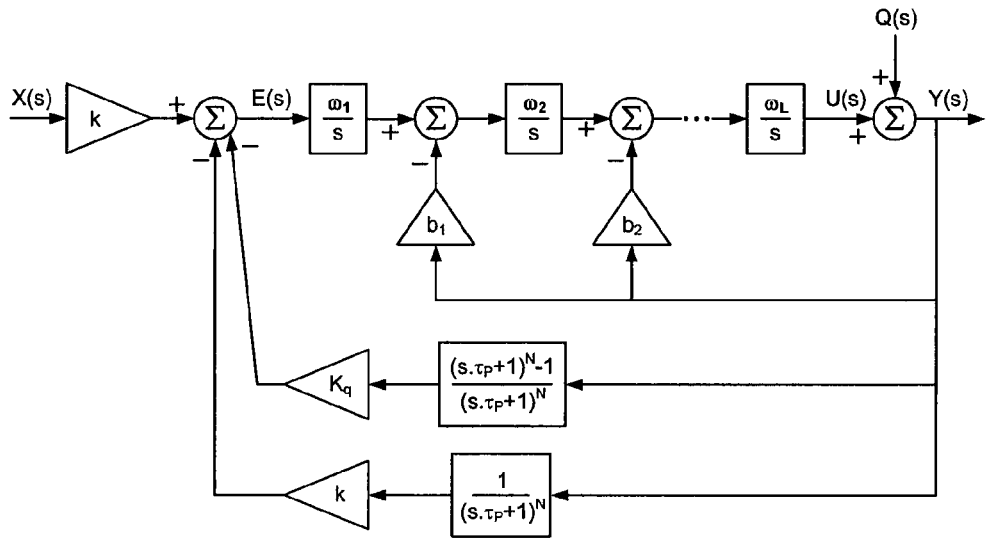
FIG. 32 depicts a ΣΔ difference-of-squares RMS-to-DC converter small-signal linear model with L integrators (feedback compensation) and $N^{th}$-order feedback LPF/HPF.

FIG. 32 shows the generalized AC small-signal model for the architecture depicted in FIGS. 31A/31B. This closed loop system with L integrators and $N^{th}$-order feedback LPF/HPF is characterized by a $(L+N)^{th}$-order noise shaping.

Based on FIG. 32, the signal-dependent feedback loop filter $L_1(s)$ can be expressed again:

$$-L_1(s) = -\frac{U(s)}{Y(s)} = \quad (36)$$

$$\frac{b_{L-1}\omega_L}{s} + \ldots + \frac{b_1 \cdot \prod_{i=2}^{L} \omega_i}{s^{L-1}} + \frac{\prod_{i=1}^{L} \omega_i}{s^L}\left(\frac{k + K_q \cdot (s\tau_P + 1)^N - K_q}{(s\tau_P + 1)^N}\right)$$

The resulting loop filter transfer function $L_1(s)$ converges to an $L^{th}$-order stable loop filter when $k \leq K_q$. As a result, the closed loop system can be designed to be conditionally stable for a certain range of input power levels ($k \propto x_{RMS}$). The LPF/HPF transfer functions, depicted as $N^{th}$-order binomials in FIG. 32, can be implemented with any different set of coefficients (e.g. Butterworth, Chebyshev, etc. . . . ) and with different cut-off frequencies ($f_{cHPF} \neq f_{cLPF}$) at the expense of a less stable closed loop behavior.

Figure 33A:
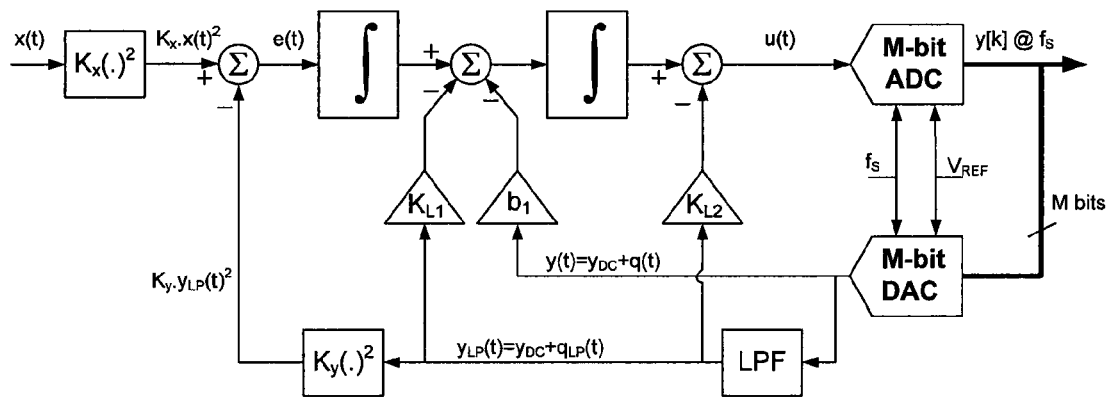
FIG. 33A depicts a ΣΔ difference-of-squares RMS-to-DC converter using two squaring circuits with two integrators (feedback compensation) and lowpass filtered feedback path.
Figure 33B:
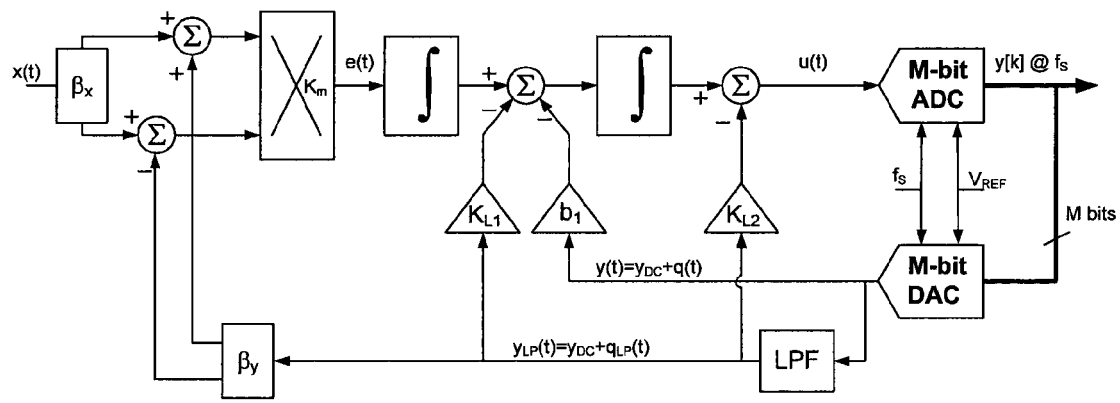
FIG. 33B depicts a ΣΔ difference-of-squares RMS-to-DC converter based on forward path multiplier with two integrators (feedback compensation) and lowpass filtered feedback path.

The feedback compensated loop filter can be combined with multiple lowpass filtered feedback paths. FIGS. 33A and 33B illustrate the main possible implementations based on this concept. Equivalent implementations can be achieved when more than two integrators are employed, multiple feedback DACs are employed and/or the LPFs are implemented in the digital domain.

Based on the relation between y(t), x(t) and u(t), the large-signal static transfer of the $\Sigma\Delta$ difference-of-squares RMS-to-DC converters in FIGS. 33A/33B can be calculated:

$$y_{DC} = \frac{-(1 + K_{L2} + A_2(b_1 + K_{L1}))}{2A_{FB}K_y} + \sqrt{\left(\frac{1 + K_{L2} + A_2(b_1 + K_{L1})}{2A_{FB}K_y}\right)^2 + \frac{K_x}{K_y}\overline{x(t)^2} - \overline{q_{lp}(t)^2}}$$ (37A)

$$y_{DC} = \frac{-(1 + K_{L2} + A_2(b_1 + K_{L1}))}{2A_{FB}K_m\beta_y^2} + \sqrt{\left(\frac{1 + K_{L2} + A_2(b_1 + K_{L1})}{2A_{FB}K_m\beta_y^2}\right)^2 + \frac{\beta_x^2}{\beta_y^2}\overline{x(t)^2} - \overline{q_{lp}(t)^2}}$$ (37B)

where $A_{FB}=A_1A_2$ is the combined DC-gain of the integrators stabilized with feedback paths, $A_1$ is the actual DC-gain of the $1^{st}$-integrator, $A_2$ is the actual DC-gain of the $2^{nd}$-integrator, $b_1$ and $K_{Lj}$ are the feedback coefficients, $q_{lp}(t)=y_{lp}(t)-y_{DC}$ is the lowpass filtered quantization noise error, expression (37A) was obtained based on FIG. 33A and expression (37B) was obtained based on FIG. 33B. In this architecture, corresponds to each integrator a component of the residual systematic error due to two feedback paths (except the last integrator). The systematic error added after the $l^{th}$ integrator (l>1) is given by:

$$\frac{(K_{L(l-1)} + b_{l-1})\prod_{j=l}^{L} A_l}{2A_{FB}K_y} = \frac{(K_{L(l-1)} + b_{l-1})\prod_{j=l}^{L} A_l}{2A_{FB}K_m\beta_y^2}$$ (38)

The major advantage of the architecture depicted in FIGS. 33A/33B compared to the architecture depicted in FIGS. 28A/28B and 25A/25B is the fact that the systematic error contribution due to the feedback coefficient $K_{Lj}$ is divided by the total DC-gain from all previous integrator (from $A_1$ to $A_j$). Therefore, the trade-off between the reduction of the quantization error mean-square value via feedback filtering and the increase of the residual systematic error due to the additional feedback paths (present on the previous architectures) is greatly reduced.

Figure 34:
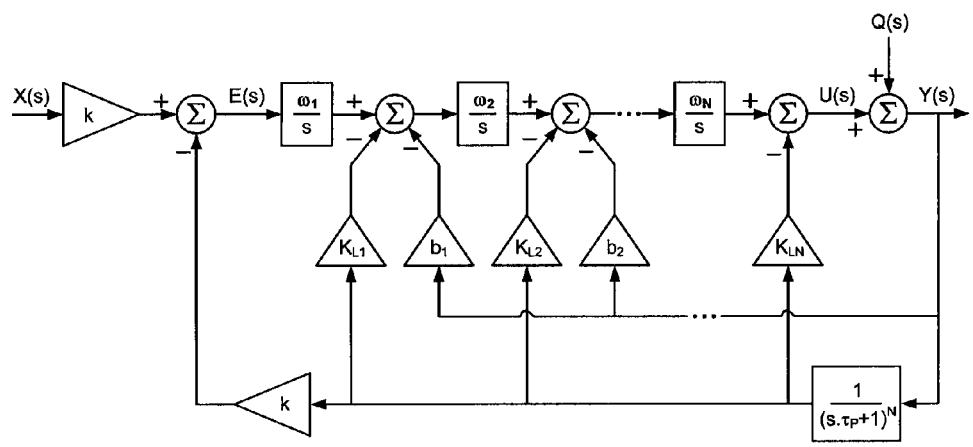
FIG. 34 depicts a ΣΔ difference-of-squares RMS-to-DC converter small-signal linear model with N integrators (feedback compensation) and $N^{th}$-order feedback LPF.

FIG. 34 shows the generalized AC small-signal model for the architecture depicted in FIGS. 33A/33B. This closed loop system with N integrators and $N^{th}$-order feedback LPF is characterized by a $2N^{th}$-order noise shaping.

The feedback loop filter transfer function $L_1(s)$ for the architecture in FIG. 34 is the same as obtained with the architecture in FIG. 32 if L=N and:

$$K_{Lj} = K_q \cdot \tau_P^j \cdot \frac{N!}{j!(N-j)!} \cdot \prod_{i=1}^{j} \omega_i$$ (39)

In this case, expression (36) is equally valid for the architecture with multiple lowpass filtered feedback paths and the resulting loop filter transfer function $L_1(s)$ converges to an $N^{th}$-order stable loop filter when $k \le K_q$. As a result, the closed loop system can be designed to be conditionally stable for a certain range of input power levels ($k \propto x_{RMS}$). The LPF transfer function, depicted as an $N^{th}$-order binomial in FIG. 34, can be implemented with any different set of coefficients (e.g. Butterworth, Chebyshev, etc. . . . ) and/or in the digital domain.

All the $\Sigma\Delta$ difference-of-squares RMS-to-DC converter architectures described herein present a conditionally stable behavior. This means that their respective closed-loop systems are only stable for certain range of input power levels. In order to be able to properly operate through a wide range of power levels, some topologies require certain implementation parameters to be optimized according to the order of magnitude of the input signal (e.g. high power levels, intermediate power levels or low power levels). Configurability is especially useful in high-order (L+N>2) $\Sigma\Delta$ RMS-to-DC converters.

Figure 35:
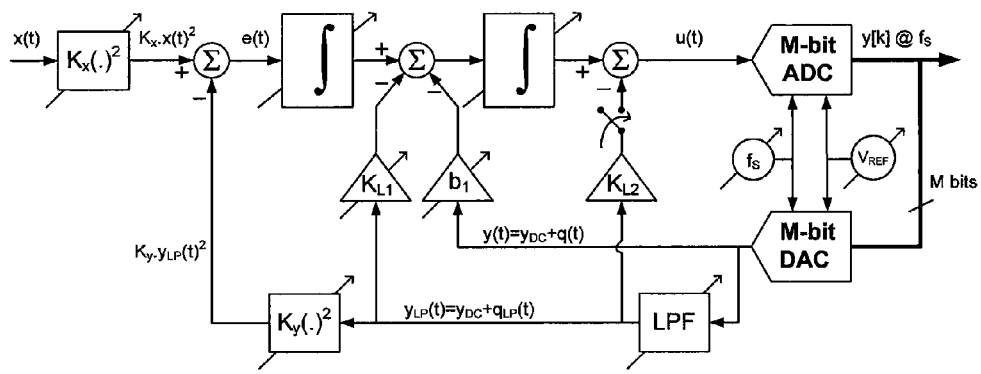
FIG. 35 depicts a configurable ΣΔ difference-of-squares RMS-to-DC converter using two squaring circuits with two integrators (feedback compensation) and lowpass filtered feedback path.
Figure 36:
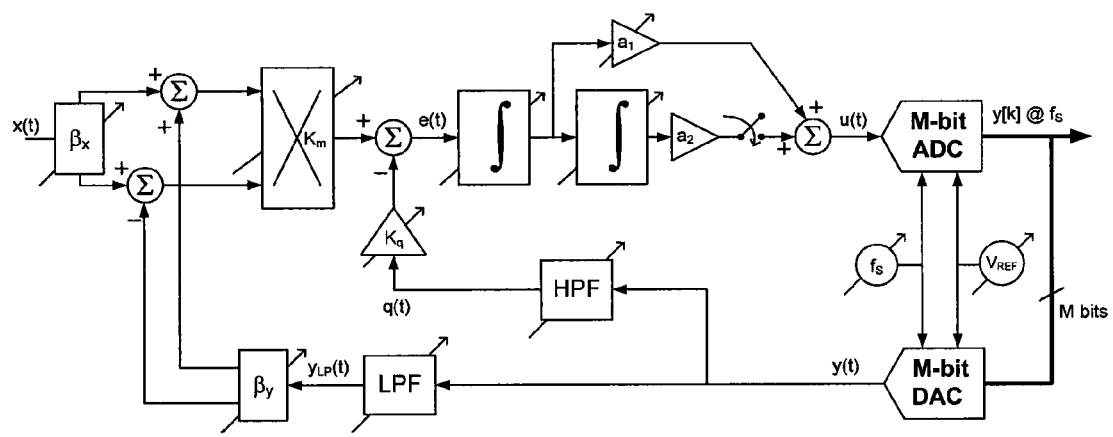
FIG. 36 depicts a configurable ΣΔ difference-of-squares RMS-to-DC converter based on forward path multiplier with two integrators (feedforward compensation) and, lowpass and highpass filtered feedback paths.

The tuning of a $\Sigma\Delta$ RMS-to-DC converter to measure a certain range of input power levels can be achieved through the electronic configuration of any internal parameter of the implementation. FIGS. 35 and 36 depict examples of configurable $\Sigma\Delta$ RMS-to-DC converters. Internal parameters like voltage/current gains, time-constants, transconductances, filter order and cut-off frequency, sampling frequency, reference voltages, etc. . . . can be configured to minimize the law-conformance error and/or to guarantee a stable $\Sigma\Delta$ closed-loop behavior. Furthermore, certain signal-paths can be connected/disconnected (turned on/off) according to the range of power levels to be measured. In a broader sense, all architectures presented herein can be combined with some kind of configurability.

Figure 37:
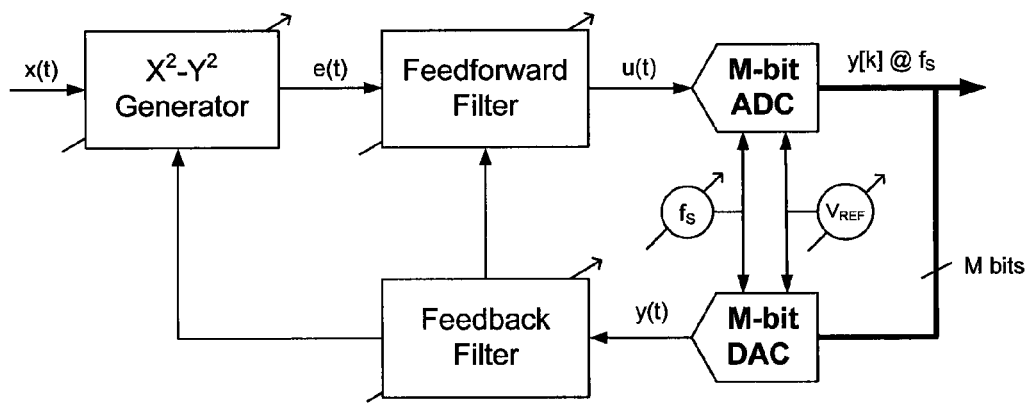
FIG. 37 depicts a configurable ΣΔ difference-of-squares RMS-to-DC converter.

Based on the principle of configurability and on all previous architectures described herein, a general description of a $\Sigma\Delta$ difference-of-squares RMS-to-DC converter is depicted in FIG. 37. Equivalent descriptions can be obtained when a part of the feedback and feedforward filters are implemented in the digital domain or as analog switched circuitry (e.g. switched capacitors), and/or multiple feedback DACs are employed.

All $\Sigma\Delta$ RMS-to-DC converter architectures described herein are fully compatible with the chopper-stabilization techniques presented in U.S. Pat. Nos. 7,545,302 and 7,545,303. For example, a possible electronic implementation of the architecture depicted in FIGS. 21A/21B, where commutators are employed to reduce the effect of DC-offsets in the output DR, is shown in FIG. 38.

Figure 38:
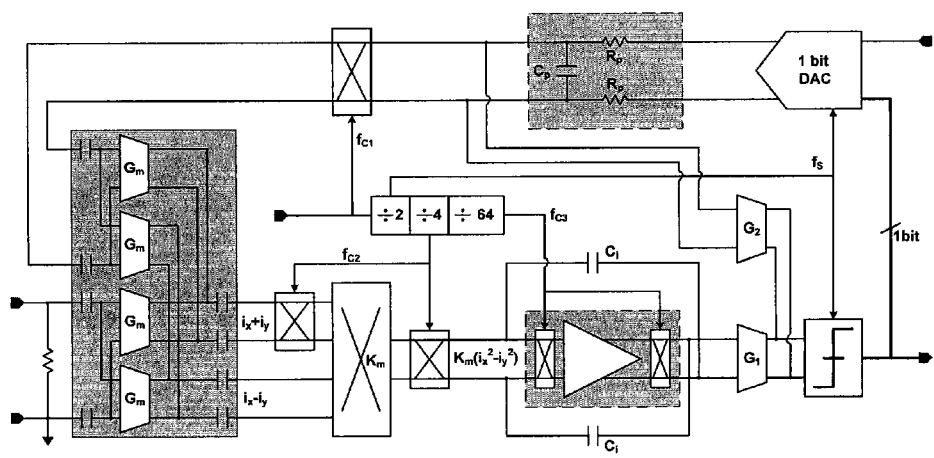
FIG. 38 depicts a possible electronic implementation of the ΣΔ difference-of-squares RMS-to-DC converter architecture depicted in FIGS. 21A/21B.

Based upon the discussion hereinabove, it can be seen that embodiments of the presently claimed invention provide a number of advantageous features including, without limitation, the following: a $\Sigma\Delta$ difference-of-squares RMS-to-digital converter, based on two squaring cells or a single forward path multiplier, with lowpass filtered and constant gain feedback paths (e.g., as depicted in FIGS. 7A/7B); a $\Sigma\Delta$ difference-of-squares RMS-to-digital converter, based on two squaring cells or a single forward path multiplier, with lowpass and highpass filtered feedback paths (e.g., as depicted in FIGS. 10A/10B); a $\Sigma\Delta$ difference-of-squares RMS-to-digital converter, based on two squaring cells or a single forward path multiplier, with multiple lowpass filtered feedback paths (e.g., as depicted in FIGS. 21A/21B and 25A/25B); a $\Sigma\Delta$ difference-of-squares RMS-to-digital converter with multiple integrators stabilized by additional feedforward paths, based on two squaring cells or a single forward path multiplier, with lowpass filtered and constant gain feedback paths; a ΣΔ difference-of-squares RMS-to-digital converter with multiple integrators stabilized by additional feedforward paths, based on two squaring cells or a single forward path multiplier, with lowpass and highpass filtered feedback paths (e.g., as depicted in FIGS. 26A/26B); a ΣΔ difference-of-squares RMS-to-digital converter with multiple integrators stabilized by additional feedforward paths, based on two squaring cells or a single forward path multiplier, with multiple lowpass filtered feedback paths (e.g., as depicted in FIGS. 28A/28B); a ΣΔ difference-of-squares RMS-to-digital converter with multiple integrators stabilized by additional feedback paths, based on two squaring cells or a single forward path multiplier, with a single feedback path where no-filtering is employed (e.g., as depicted in FIGS. 30A/30B); a ΣΔ difference-of-squares RMS-to-digital converter with multiple integrators stabilized by additional feedback paths, based on two squaring cells or a single forward path multiplier, with a single feedback path where a LPF or Pole-Zero filter is employed; a ΣΔ difference-of-squares RMS-to-digital converter with multiple integrators stabilized by additional feedback paths, based on two squaring cells or a single forward path multiplier, with lowpass filtered and constant gain feedback paths; a ΣΔ difference-of-squares RMS-to-digital converter with multiple integrators stabilized by additional feedback paths, based on two squaring cells or a single forward path multiplier, with lowpass and highpass filtered feedback paths (e.g., as depicted in FIGS. 31A/31B); a ΣΔ difference-of-squares RMS-to-digital converter with multiple integrators stabilized by additional feedback paths, based on two squaring cells or a single forward path multiplier, with multiple lowpass filtered feedback paths (e.g., as depicted in FIGS. 33A/33B); a ΣΔ difference-of-squares RMS-to-digital converter with electronically configurable parameters (e.g., as depicted in FIGS. 35, 36 and 37); and a ΣΔ difference-of-squares RMS-to-digital converter employing chopper-stabilization (e.g., as depicted in FIG. 38) as described in U.S. Pat. Nos. 7,545,302 and 7,545,303.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a sigma-delta difference-of-squares RMS-to-DC converter, comprising:
   analog signal multiplication and combining circuitry responsive to an analog input signal and at least first and second analog feedback signals by providing a resultant analog signal that includes at least one signal component corresponding to a difference between a square of said analog input signal, a square of said first analog feedback signal and said second analog feedback signal;
   analog signal filter circuitry coupled to said analog signal multiplication and combining circuitry, and responsive to said resultant analog signal by providing a filtered analog signal;
   analog-to-digital conversion (ADC) circuitry coupled to said analog signal filter circuitry and responsive to said filtered analog signal by providing a related digital output signal;
   digital-to-analog conversion (DAC) circuitry coupled to said ADC circuitry and responsive to said digital output signal by providing an analog signal;
   first feedback circuitry coupled between said DAC circuitry and said analog signal multiplication and combining circuitry, and responsive to said analog signal by providing said first analog feedback signal; and
   second feedback circuitry coupled between said DAC circuitry and said analog signal multiplication and combining circuitry, and responsive to said analog signal by providing said second analog feedback signal.

2. The apparatus of claim 1, wherein said analog signal multiplication and combining circuitry comprises:
   first analog signal multiplication circuitry responsive to said analog input signal by providing a first analog product signal;
   second analog signal multiplication circuitry responsive to said first analog feedback signal by providing a second analog product signal; and
   analog signal combining circuitry coupled to said first and second analog signal multiplication circuitries, and responsive to said first and second analog product signals and said second analog feedback signal by providing said resultant analog signal.

3. The apparatus of claim 1, wherein said analog signal multiplication and combining circuitry comprises:
   analog input signal router circuitry responsive to an analog input signal by providing first and second routed analog input signals related to said analog input signal;
   analog feedback signal router circuitry responsive to said first analog feedback signal by providing first and second routed analog feedback signals related to said first analog feedback signal;
   first analog signal combining circuitry coupled to said analog input signal router circuitry and said analog feedback signal router circuitry, and responsive to said first and second routed analog input signals and said first and second routed analog feedback signals by providing first and second combined analog signals related to combinations of said first routed analog input and feedback signals and said second routed analog input and feedback signals, respectively;
   analog signal multiplication circuitry coupled to said first analog signal combining circuitry and responsive to said first and second combined analog signals by providing an analog product signal that includes at least one signal component corresponding to a difference between a product of said first and second routed analog input signals and a product of said first and second routed analog feedback signals; and
   second analog signal combining circuitry coupled to said analog signal multiplication circuitry and responsive to said analog product signal and said second analog feedback signal by providing said resultant analog signal.

4. The apparatus of claim 1, wherein said analog signal filter circuitry comprises:
   first filter circuitry responsive to said resultant analog signal by providing a first intermediate signal;
   second filter circuitry coupled to said first filter circuitry and responsive to said first filtered signal by providing a second intermediate signal;
   scaling circuitry coupled to said first filter circuitry and responsive to said first intermediate signal by providing a third intermediate signal; and
   analog signal combining circuitry coupled to said second filter circuitry and said scaling circuitry, and responsive to said second and third intermediate signals by providing said filtered analog signal.

5. The apparatus of claim 1, further comprising third feedback circuitry coupled between said DAC circuitry and said analog signal filter circuitry, and responsive to said analog signal by providing a third analog feedback signal, wherein said analog signal filter circuitry includes:
first filter circuitry responsive to said resultant analog signal by providing an intermediate filtered signal;
analog signal combining circuitry coupled to said first filter circuitry and said third feedback circuitry, and responsive to said intermediate filtered signal and said third analog feedback signal by providing a combined analog signal; and
second filter circuitry coupled to said analog signal combining circuitry and responsive to said combined analog signal by providing said filtered analog signal.

6. The apparatus of claim 1, wherein said first feedback circuitry comprises signal filtering circuitry.

7. The apparatus of claim 1, wherein said second feedback circuitry comprises signal scaling circuitry.

8. The apparatus of claim 7, wherein said second feedback circuitry further comprises signal filtering circuitry serially coupled with said signal scaling circuitry.

9. The apparatus of claim 8, wherein said analog signal filter circuitry comprises:
first filter circuitry responsive to said resultant analog signal by providing a first intermediate signal;
second filter circuitry coupled to said first filter circuitry and responsive to said first filtered signal by providing a second intermediate signal;
scaling circuitry coupled to said first filter circuitry and responsive to said first intermediate signal by providing a third intermediate signal; and
analog signal combining circuitry coupled to said second filter circuitry and said scaling circuitry, and responsive to said second and third intermediate signals by providing said filtered analog signal.

10. The apparatus of claim 8, further comprising third feedback circuitry coupled between said DAC circuitry and said analog signal filter circuitry, and responsive to said analog signal by providing a third analog feedback signal, wherein said analog signal filter circuitry includes:
first filter circuitry responsive to said resultant analog signal by providing an intermediate filtered signal;
analog signal combining circuitry coupled to said first filter circuitry and said third feedback circuitry, and responsive to said intermediate filtered signal and said third analog feedback signal by providing a combined analog signal; and
second filter circuitry coupled to said analog signal combining circuitry and responsive to said combined analog signal by providing said filtered analog signal.

11. An apparatus including a sigma-delta difference-of-squares RMS-to-DC converter, comprising:
analog signal multiplier and combiner means for multiplying and combining an analog input signal and at least first and second analog feedback signals to provide a resultant analog signal that includes at least one signal component corresponding to a difference between a square of said analog input signal, a square of said first analog feedback signal and said second analog feedback signal;
analog signal filter means for filtering said resultant analog signal to provide a filtered analog signal;
analog-to-digital converter (ADC) means for converting said filtered analog signal to a related digital output signal;
digital-to-analog converter (DAC) means for converting said digital output signal to an analog signal;
first feedback means for processing said analog signal to provide said first analog feedback signal; and
second feedback means for processing said analog signal to provide said second analog feedback signal.

12. A method for performing a sigma-delta difference-of-squares RMS-to-DC conversion, comprising:
multiplying and combining an analog input signal and at least first and second analog feedback signals to provide a resultant analog signal that includes at least one signal component corresponding to a difference between a square of said analog input signal, a square of said first analog feedback signal and said second analog feedback signal;
filtering said resultant analog signal to provide a filtered analog signal;
converting said filtered analog signal to a related digital output signal;
converting said digital output signal to an analog signal;
processing said analog signal to provide said first analog feedback signal; and
processing said analog signal to provide said second analog feedback signal.

13. An apparatus including a sigma-delta difference-of-squares RMS-to-DC converter, comprising:
analog signal multiplication and combining circuitry responsive to an analog input signal and a first analog feedback signal by providing a resultant analog signal that includes at least one signal component corresponding to a difference between a square of said analog input signal and a square of said first analog feedback signal;
analog signal filtering and combining circuitry coupled to said analog signal multiplication and combining circuitry, and responsive to said resultant analog signal and at least a second analog feedback signal by providing a feedforward signal;
analog-to-digital conversion (ADC) circuitry coupled to said analog signal filtering and combining circuitry and responsive to said feedforward signal by providing a related digital output signal; and
feedback circuitry, including digital-to-analog conversion (DAC) circuitry, coupled between said ADC circuitry, said analog signal multiplication and combining circuitry and said analog signal combining circuitry, and responsive to said digital output signal by providing said first analog feedback signal and said at least a second analog feedback signal.

14. The apparatus of claim 13, wherein:
said analog signal filtering and combining circuitry comprises
forward signal filtering circuitry responsive to said resultant analog signal by providing a filtered analog signal, and
analog signal combining circuitry coupled to said analog signal filtering circuitry and responsive to said filtered analog signal and said second analog feedback signal by providing a combined analog signal as said feedforward signal; and
said feedback circuitry comprises
said DAC circuitry, responsive to said digital output signal by providing an analog signal, feedback signal filtering circuitry coupled to said DAC circuitry and responsive to said analog signal by providing a filtered analog signal as said first analog feedback signal, and feedback signal scaling circuitry coupled to said feedback signal filtering circuitry and responsive to said first analog feedback signal by providing said second analog feedback signal.

15. The apparatus of claim 13, wherein said at least a second analog feedback signal comprises at least second and third analog feedback signals, and said feedback circuitry comprises:

said DAC circuitry, responsive to said digital output signal by providing an analog signal;

feedback signal filtering circuitry coupled to said DAC circuitry and responsive to said analog signal by providing a plurality of successively filtered analog signals, wherein one of said successively filtered analog signals is provided as said first analog feedback signal; and feedback signal scaling circuitry coupled to said feedback signal filtering circuitry and responsive to at least a portion of said plurality of successively filtered analog signals by providing said at least second and third analog feedback signals.

16. The apparatus of claim 15, wherein:

a first portion of said analog signal filtering and combining circuitry comprises a first analog signal filter circuit responsive to said resultant analog signal by providing a first filtered analog signal;

a second portion of said analog signal filtering and combining circuitry comprises a first analog signal combining circuit coupled to said first analog signal filter circuit and responsive to said first filtered analog signal and said at least a second analog feedback signal by providing a first combined analog signal;

a third portion of said analog signal filtering and combining circuitry comprises a second analog signal filter circuit coupled to said first analog signal combining circuit and responsive to said first combined analog signal by providing a second filtered analog signal;

a fourth portion of said analog signal filtering and combining circuitry comprises forward signal scaling circuitry coupled to said first analog signal combining circuit and responsive to said first combined analog signal by providing a forward scaled signal; and a fifth portion of said analog signal filtering and combining circuitry comprises a second analog signal combining circuit coupled to said second analog signal filter circuit and said forward signal scaling circuitry, and responsive to said second filtered analog signal and said forward scaled signal by providing a second combined analog signal as said feedforward signal.

17. The apparatus of claim 13, wherein:

said at least a second analog feedback signal comprises a plurality of analog feedback signals;

said feedback circuitry comprises said DAC circuitry, responsive to said digital output signal by providing said first analog feedback signal, and feedback signal scaling circuitry coupled to said DAC circuitry and responsive to said first analog feedback signal by providing said plurality of analog feedback signals; and said analog signal filtering and combining circuitry comprises a plurality of analog signal filter circuits and a plurality of analog signal combining circuits mutually coupled in an alternating manner, and responsive to said resultant analog signal and said plurality of analog feedback signals by successively filtering upstream signals and combining respective ones of said filtered upstream signals with respective ones of said plurality of analog feedback signals to provide said feedforward signal.

18. The apparatus of claim 13, wherein:

said at least a second analog feedback signal comprises second, third and fourth analog feedback signals;

said feedback circuitry comprises said DAC circuitry, responsive to said digital output signal by providing an analog signal, feedback signal filtering circuitry coupled to said DAC circuitry and responsive to said analog signal by providing a filtered analog signal as said first analog feedback signal, first feedback signal scaling circuitry coupled to said DAC circuitry and responsive to said analog signal by providing said second analog feedback signal, second feedback signal scaling circuitry coupled to said feedback signal filtering circuitry and responsive to said first analog feedback signal by providing said third analog feedback signal, and third feedback signal scaling circuitry coupled to said feedback signal filtering circuitry and responsive to said first analog feedback signal by providing said fourth analog feedback signal;

a first portion of said analog signal filtering and combining circuitry comprises a first analog signal filter circuit responsive to said resultant analog signal by providing a first filtered analog signal;

a second portion of said analog signal filtering and combining circuitry comprises a first analog signal combining circuit coupled to said first analog signal filter circuit and responsive to said first filtered analog signal and said second and third analog feedback signals by providing a first combined analog signal;

a third portion of said analog signal filtering and combining circuitry comprises a second analog signal filter circuit coupled to said first analog signal combining circuit and responsive to said first combined analog signal by providing a second filtered analog signal; and a fourth portion of said analog signal filtering and combining circuitry comprises a second analog signal combining circuit coupled to said second analog signal filter circuit and responsive to said second filtered analog signal and said fourth analog feedback signal by providing a second combined analog signal as said feedforward signal.

19. An apparatus including a sigma-delta difference-of-squares RMS-to-DC converter, comprising:

analog signal multiplier and combiner means for multiplying and combining an analog input signal and a first analog feedback signal to provide a resultant analog signal that includes at least one signal component corresponding to a difference between a square of said analog input signal and a square of said first analog feedback signal;

analog signal filter and combiner means for filtering and combining said resultant analog signal and at least a second analog feedback signal to provide a feedforward signal;

analog-to-digital converter (ADC) means for converting said feedforward signal to a related digital output signal; and feedback means, including digital-to-analog converter (DAC) means, for converting said digital output signal to said first analog feedback signal and said at least a second analog feedback signal.

20. A method for performing a sigma-delta difference-of-squares RMS-to-DC conversion, comprising:

multiplying and combining an analog input signal and a first analog feedback signal to provide a resultant analog signal that includes at least one signal component corresponding to a difference between a square of said analog input signal and a square of said first analog feedback signal;

filtering and combining said resultant analog signal and at least a second analog feedback signal to provide a feedforward signal;

converting said feedforward signal to a related digital output signal; and converting said digital output signal to said first analog feedback signal and said at least a second analog feedback signal.

* * * * *